(12) United States Patent
Aoki et al.

(10) Patent No.: US 6,573,650 B2
(45) Date of Patent: Jun. 3, 2003

(54) ELECTROLUMINESCENT DEVICE AND PROCESS FOR PRODUCING THE SAME

(75) Inventors: Daigo Aoki, Tokyo-To (JP); Masato Okabe, Tokyo-To (JP); Hironori Kobayashi, Tokyo-To (JP); Manabu Yamamoto, Tokyo-To (JP); Tatsuya Miyoshi, Tokyo-To (JP); Koji Arai, Tokyo-To (JP); Hiroshi Kishimoto, Tokyo-To (JP)

(73) Assignee: Dai Nippon Printing Co., Ltd. (JP)

( * ) Notice: Subject to any disclaimer, the term of this patent is extended or adjusted under 35 U.S.C. 154(b) by 168 days.

(21) Appl. No.: 09/789,748

(22) Filed: Feb. 22, 2001

(65) Prior Publication Data

US 2001/0022497 A1 Sep. 20, 2001

(30) Foreign Application Priority Data

Feb. 23, 2000 (JP) ........................................ 2000-045566
Mar. 14, 2000 (JP) ........................................ 2000-070493
Apr. 25, 2000 (JP) ........................................ 2000-124063

(51) Int. Cl.⁷ ............................................... H01J 63/04
(52) U.S. Cl. ........................................ 313/503; 313/506
(58) Field of Search ................................. 313/503, 504, 313/506

(56) References Cited

U.S. PATENT DOCUMENTS 5,917,279 A   6/1999   Elschner et al.
5,972,419 A  10/1999   Roitman ........................ 427/66
6,395,409 B2 * 5/2002  Ueda et al. .................. 428/690

FOREIGN PATENT DOCUMENTS

EP   0 862 156 A1   9/1998
EP   0 932 081 A1   7/1999
EP   1 008 873 A1   6/2000
WO   WO 99/66483   12/1999

* cited by examiner

Primary Examiner—Quana M. Grainger
(74) Attorney, Agent, or Firm—Parkhurst & Wendel, L.L.P.

(57) ABSTRACT

An EL device comprising a first electrode, an EL layer formed on the first electrode, and a second electrode formed on the EL layer, wherein at least one layer of a material whose wettability changes when light is applied thereto is formed. The invention provides EL devices that can be simply produced, and processes for producing the same.

35 Claims, 6 Drawing Sheets

ELECTROLUMINESCENT DEVICE AND PROCESS FOR PRODUCING THE SAME

TECHNICAL FIELD

The present invention relates to electroluminescent devices (hereinafter referred to as EL devices), especially organic thin-film EL devices, useful for displays, and to processes for producing the same.

BACKGROUND

There is a great deal of interest in the application of EL devices to spontaneous-emission panel displays. In particular, organic thin-film EL displays using organic substances as luminous materials emit light of high luminance even at low applied voltages of not more than 10 V, and thus show excellent luminous efficiencies. Moreover, these displays can emit light even when the EL devices used have simple structures. There is therefore such a hope that organic thin-film EL displays be applied to high-resolution full-color displays, or to inexpensive simple displays that are used for displaying fixed patterns for advertisement or the like by the emission of light.

The production of displays using EL devices practically requires the patterning of electrodes and of organic EL layers, and typically includes a photolithographic process, or a patterning process using a complicated system for pattern-wise depositing films. Such production processes are complicated, and bring about increase in production cost. Further, a process in which an organic EL film is formed pattern-wise by deposition using a mask requires a vacuum apparatus, which is expensive. Problems with this process are decrease in yield, and increase in cost. On the other hand, a process in which patterns are formed by an ink jet process includes steps that are relatively simple; however, this process has the problems of decrease in yield and in evenness of film thickness. In addition, EL devices for displaying patterns for advertisement are required to take various shapes and to have greatly increased surface areas. The production of such EL devices is confronted with the problem of remarkable decrease in productivity.

Thus, the production of EL devices, especially that of organic EL displays, includes the patterning of electrodes, organic EL layers, insulating layers, etc., so that it inevitably includes a considerably great number of steps. The production of EL devices, therefore, has problems awaiting solution on yield, productivity and cost. In addition, it is important to increase the pattern accuracy of a luminous layer in order to improve displaying properties, so that it is necessary to accurately provide, on an electrode, a luminous layer with a uniform thickness.

An object of the present invention is to provide an EL device that can be produced more simply than ever, and a process for producing the same; in particular, an EL device whose constituent layers such as a luminous layer and a partitioning layer have excellent pattern accuracy and which emits light with high uniformity, and a process for producing such an EL device.

DISCLOSURE OF THE INVENTION

We found that the aforementioned problems in the prior art can be solved by applying light pattern-wise to a layer of a material whose wettability changes when light is applied thereto, thereby forming on the layer a latent pattern due to the difference in wettability, and then forming an EL layer, a partitioning layer, an insulating layer, a first electrode, a second electrode, etc. by utilizing this latent pattern. The present invention was accomplished on the basis of this finding.

Accordingly, the present invention is an EL device comprising a first electrode, an EL layer formed on the first electrode, and a second electrode formed on the EL layer, characterized by being provided with at least one layer of a material whose wettability changes when light is applied thereto.

BEST MODE FOR CARRYING OUT THE INVENTION

EL devices

As mentioned above, the EL device of the present invention comprises a first electrode, an EL layer formed on the first electrode, and a second electrode formed on the EL layer, and is characterized by being provided with at least one layer of a material whose wettability changes when light is applied thereto, such as a photocatalyst-containing layer. The EL device of the present invention may comprise optional layers that are usually provided in conventional EL devices. In the case where the EL device is a full-color display in which fine picture elements are formed by patterning, the effects of the invention can fully be obtained.

First Embodiment

Figure 1A:
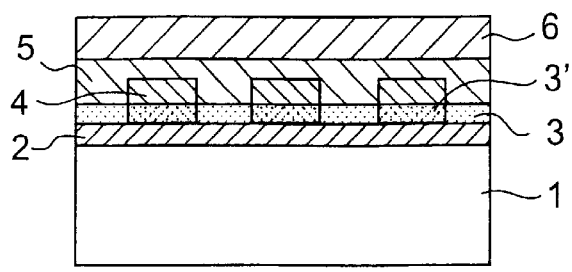
FIG. 1 is a cross-sectional view showing the structure of one EL device of the present invention.
Figure 1B:
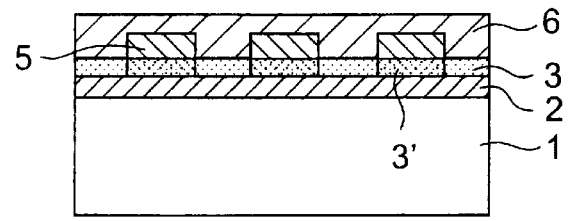

FIG. 1 is a cross-sectional view showing one example of the EL device according to the present invention. This EL device has the following structure: a first electrode 2, a photocatalyst-containing layer 3, an EL layer 5 and a second electrode 6 are laminated to a substrate 1 in the order mentioned, and another EL layer 4 is formed between the wettability-changed part 3, of the photocatalyst-containing layer 3 and the EL layer 5.

Second Embodiment

Figure 2:
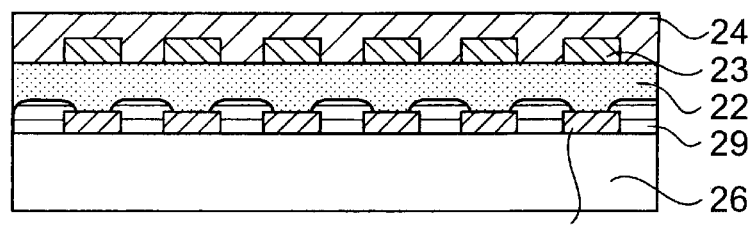
FIG. 2 is a cross-sectional view showing the structure of one EL device of the present invention.

FIG. 2 is a cross-sectional view for illustrating a first EL device according to the second embodiment of the present invention. In this figure, reference numeral 21 indicates a patterned first electrode; reference numeral 24, a patterned second electrode; reference numeral 22, a wettability-changeable material layer; reference numeral 23, a luminous layer; reference numeral 26, a substrate; and reference numeral 29, an insulating layer.

As shown in FIG. 2, the first EL device according to the second embodiment of the present invention has the following structure: the luminous layer 23 corresponding to the pattern of the first electrode 21 is sandwiched between the two patterned electrodes 21, 24, and the wettability-changeable material layer 22 is provided between the patterned first electrode 21 and the luminous layer 23.

The wettability-changeable material layer 22 is firstly laminated to the substrate 26 on which the first electrode 21 and the insulating 29 have been provided, and light is then applied to the layer 22 through a mask having the same pattern as that of the first electrode 21, or a mask having openings that are larger than the border of the patterned first electrode 21. In the course of this process, a part of the wettability-changeable material layer 22 that corresponds to the border of the patterned first electrode 21 becomes an exposed part having increased wettability against the laminating material, while a part of the wettability-changeable material layer 22 that corresponds to the part where the border of the patterned first electrode 21 do not exist becomes an unexposed part. The luminous layer 23 is formed pattern-wise by utilizing the difference in the wettability against the laminating material, which is a luminous-layer-forming material, between the exposed part and the unexposed part of the wettability-changeable material layer 22. In order to prevent short circuit, it is herein preferable to cover, with the insulating layer 29, the edges of the border of the patterned electrode 21 and those parts that are between the borders of the same.

Figure 3:
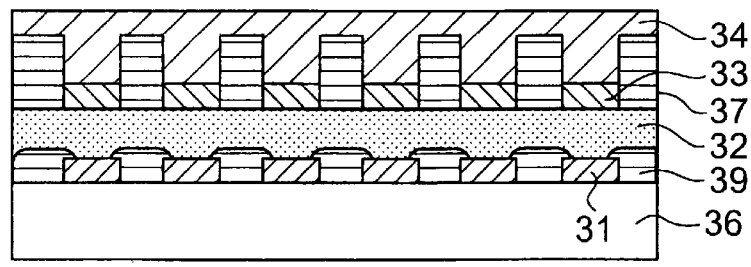
FIG. 3 is a cross-sectional view showing the structure of one EL device of the present invention.

By referring now to FIG. 3, a second EL device according to the second embodiment of the present invention will be described. The EL device shown in FIG. 3 is the same as that shown in FIG. 1 except that a partitioning layer 37 is formed between the borders of a patterned luminous layer 33. With this partitioning layer, continuity across the two electrodes can be prevented more reliably. To form the partitioning layer, a polymeric organic material, preferably an ultraviolet-curing resin, having a resistance of $10^7$ Ω.cm or more is used. Further, if the partitioning layer is made to have a dark color such as black, the resulting EL device can display a pattern more sharply. The partitioning layer 37 is formed so that its thickness will be between 0.1 μm and 10 μm, preferably between 1 μm and 2 μm.

To make the EL device shown in FIG. 3, a wettability-changeable material layer 32 is formed after forming pattern-wise an electrode 31 and an insulating layer 39. Subsequently, only a part of the wettability-changeable material layer 32 that corresponds to the part between the borders of the patterned electrode 31 is exposed to light, thereby making the surface of this part an exposed part. When a material for forming the partitioning layer is applied by uniform coating or the like, it adheres only to the exposed part. In the case where an ultraviolet-curing resin is used as the material for forming the partitioning layer, ultraviolet light is uniformly applied to the resin to cure it, and, at the same time, to change a part of the wettability-changeable material layer that corresponds to the border of the patterned electrode to an exposed part. Subsequently, a luminous layer is formed by the use of an ink jet process or the like as in the production of the EL device shown in FIG. 2, thereby obtaining the desired EL device. In order to prevent crosstalk between the borders of the patterned electrode 21, it is preferable to cover, with an insulating layer 39, the edges of the border of the patterned electrode 21 and those parts that are between the borders of the same.

Figure 4:
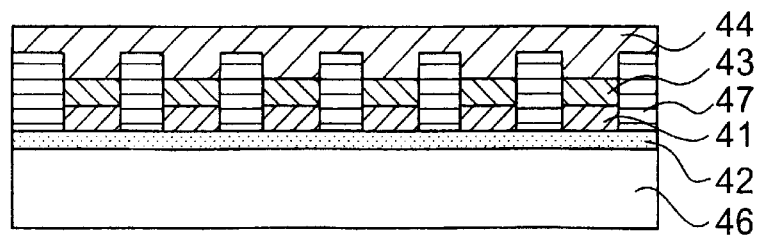
FIG. 4 is a cross-sectional view showing the structure of one EL device of the present invention.

FIG. 4 shows an EL device that is the same as the one shown in FIG. 2 except that a wettability-changeable material layer 42 is provided on a substrate 46. Since the EL device shown in FIG. 4 has such a structure, it is excellent in pattern accuracy. The wettability-changeable material layer 42 may also be provided on a luminous layer 43. Thus, the wettability-changeable material layer may be provided at any position as long as the injection of charges is not inhibited. Moreover, this layer may be composed of either a single layer or multiple layers.

The EL device shown in FIG. 4 can be made in the following manner. After uniformly forming the wettability-changeable material layer 42 on the substrate 46, light is applied only to a part of the layer 42 on which an electrode is supposed to be formed, and a material for forming the electrode is sputtered on this exposed part. Subsequently, a material for forming a luminous layer is applied by uniform coating, whereby the luminous layer is formed only on the electrode. Thereafter, only a part of the wettability-changeable material layer that is between the borders of the patterned luminous layer is exposed to light to make it an exposed part, and a material for forming a partitioning layer is applied to the exposed part by an ink jet process or the like to form a partitioning layer. An EL device can thus be obtained as in the case of the EL device shown in FIG. 2. The EL device shown in FIG. 4 is excellent in pattern accuracy like the EL devices shown in FIGS. 2 and 3. Moreover, this EL device is also excellent in injection of charges from the electrodes 41,44 to the luminous layer, so that it has high luminous efficiency.

The luminous layer may be a mono-colored, patterned layer. Alternatively, luminous layers of R, G and B may be alternately and sequentially laminated to the wettability-changeable material layer to obtain a full-color structure. Each luminous layer can be laminated in the following manner: (1) anode/wettability-changeable material layer/hole-injection layer (buffer layer)/luminous layer/electron-transfer layer/electron-injection layer (buffer layer)/cathode, or (2) anode/hole-injection layer (buffer)/luminous layer/electron-transfer layer/electron-injection layer (buffer layer)/wettability-changeable material layer/cathode.

In the above (1) and (2), instead of separately forming the charge-injection layer, the charge-transfer layer and the luminous layer, one layer may be formed by the use of a material having all of the functions of these layers. Alternatively, a mixture of materials, each having one of the functions may be used.

Third Embodiment

The third embodiment of the present invention is an EL device capable of displaying, by the emission of light, a pattern that is different from the patterns of two facing electrodes. To produce this EL device, it is not necessary to conduct the patterning of electrodes, so that the production process becomes simpler. Further, the EL device according to the third embodiment of the present invention may contain at least one photocatalyst-containing layer between the two facing electrodes. This layer is provided in order to simplify the production process, and surprisingly, it never mars the light emission properties of the EL device even when it is made from an insulating material.

A first mode of the pattern-wise emission of light by the EL device of the present invention is as follows: an EL layer is formed pattern-wise on a photocatalyst-containing layer, and this patterned EL layer is caused to emit light. Although this EL layer encompasses, as more specific concept, charge-injection layers (a hole-injection layer and an electron-injection layer), charge-transfer layers (a hole-transfer layer and an electron-transfer layer), and a luminous layer, it is herein enough to pattern at least one of these layers. For instance, the EL device may have a photocatalyst-containing layer on anode, a patterned hole-injection layer on the photocatalyst-containing layer, and a luminous layer provided on the entire-surface of the hole-injection layer regardless of its pattern. The following is also acceptable: a luminous layer is formed pattern-wise, and another luminous layer whose color is different from that of the patterned luminous layer is provided on the entire surface of the patterned luminous layer. By doing so, the resulting EL device can display a pattern by the emission of light while emitting light from its entire surface.

A second mode of the pattern-wise emission of light by the EL device of the present invention is as follows: an insulating layer is formed pattern-wise on a photocatalyst-containing layer, and the non-insulated part of an EL layer is caused to emit light.

Figure 5:
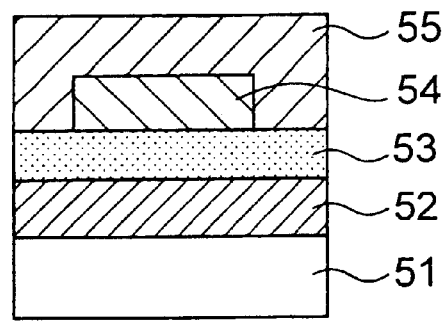
FIG. 5 is a cross-sectional view showing the structure of one EL device of the present invention.

FIG. 5 is a cross-sectional view showing the structure of one EL device according to the third embodiment of the present invention. In this EL device, a first electrode 52, a photocatalyst-containing layer 53 and a second electrode 55 are provided on a substrate 1 in the order mentioned, and between the second electrode 55 and the photocatalyst-containing layer 53, a luminous layer 54 is provided only on the part with which it is intended to attain pattern-wise emission of light. Unexpectedly, it is possible, in such an EL device, to inject charges into the luminous layer through the photocatalyst-containing layer while preventing continuity across the first electrode 52 and the second electrode 55, thereby causing the luminous layer to emit light.

Figure 6:
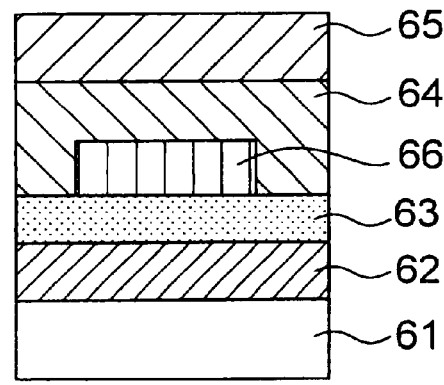
FIG. 6 is a cross-sectional view showing the structure of one EL device of the present invention.

FIG. 6 is a cross-sectional view showing the structure of another EL device according to the third embodiment of the present invention. In this EL device, a first electrode 62, a photocatalyst-containing layer 63, a luminous layer 64, and a second electrode 65 are provided on a substrate 61 in the order mentioned, and between the luminous layer 64 and the photocatalyst-containing layer 63, a charge-injection layer 66 is provided only on the part with which it is intended to attain pattern-wise emission of light. In such an EL device, it is typical that the part where the charge-injection layer is formed emits light and that the part where the charge-injection layer is not formed does not emit light. However, it is also possible to obtain an EL device in which the part where the charge-injection layer is formed emits light, and the part where the charge-injection layer is not formed also emits light but with extremely low intensity.

Further, if another luminous layer is formed instead of the patterned charge-injection layer shown in FIG. 6, the resulting EL device can attain the emission of light of two colors owing to this luminous layer and the luminous layer formed on the entire surface of the device.

Figure 7:
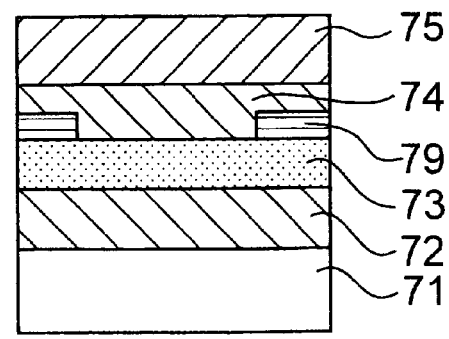
FIG. 7 is a cross-sectional view showing the structure of one EL device of the present invention.

FIG. 7 is a cross-sectional view showing the structure of another EL device according to the third embodiment of the present invention. In this EL device, a first electrode 72, a photocatalyst-containing layer 73 and a second electrode 75 are provided on a substrate 71 in the order mentioned; and between the second electrode 75 and the photocatalyst-containing layer 73, an insulating layer 79 is provided only on the part that is not allowed to emit light, while a luminous layer 74 is entirely provided.

The EL devices of the present invention can be used for various applications. For example, they are useful for nameplates, billboards, signboards, emergency/warning signs, road signs, the indication of fixed letters on clockfaces or on the indicators of meters, price tags, menus, leaflets, post cards, greeting cards, prepaid cards, paper-like displays, electronic books, lighting, toys for use in amusement facilities and the like, the indication of logo marks, advertising signboards, calendars, displays, batch maps, and the indication of fixed patterns such as map symbols and patterns (marks) whose shapes themselves have particular meanings.

Fourth Embodiment

The EL device according to the fourth embodiment of the present invention is the same as the EL device of the first embodiment mentioned previously except that the photocatalyst-containing layer contains a substance capable of improving light emission properties.
Layer of Material Whose Wettability Changes when Light Is Applied Thereto The layer of a material whose wettability changes when light is applied thereto for use in the present invention includes photocatalyst-containing layers containing photocatalysts of a narrow sense, represented by photo-semiconductors such as titanium oxide, and specific polymeric organic layers. In this specification, the term "photocatalyst-containing layer" and the term "layer of a material whose wettability changes when light is applied thereto" that includes the above-described layers are sometimes used interchangeably.
Photocatalyst-Containing Layer
(Photocatalyst-Containing Layer)

In the present invention, the photocatalyst-containing layer means a layer whose wettability will change when light is applied thereto, or a layer whose wettability has already changed by the application of light. The photocatalyst herein may be any substance as long as it can cause the above change in wettability. When the photocatalyst-containing layer is subjected to pattern-wise exposure, a latent pattern due to the difference in wettability is formed on the photocatalyst-containing layer. Typically, the unexposed part of the photocatalyst-containing layer is water and/or oil repellent, while the exposed part of the same is highly hydrophilic and/or lipophilic. In the present invention, by utilizing this latent pattern due to the difference in wettability, formed on the surface of the photocatalyst-containing layer, those layers that are supposed to come on the photocatalyst-containing layer (an EL layer, a first electrode, a second electrode, etc.) are conveniently formed with high accuracy.

In First, Second and Third Embodiments

The photocatalyst-containing layer for use in the present invention can be provided at any position as long as it is between the substrate and the second electrode. For example, the photocatalyst-containing layer may be provided between the substrate and the first electrode, or between the first electrode and the EL layer (when the EL layer is composed of a plurality of layers, between the constituent layers of the EL layer), or between the EL layer and the second electrode. It is however preferable to provide the photocatalyst-containing layer between the first electrode and the EL layer, thereby forming pattern-wise the EL layer by utilizing the above-described latent pattern. In addition, not only one but also two or more photocatalyst-containing layers may be formed. In the latter case, it becomes easy to pattern, with high accuracy, a plurality of layers that are formed on the photocatalyst-containing layers.

When the photocatalyst-containing layer is too thin, a clear difference in wettability cannot be obtained, so that it is difficult to conduct the patterning of a layer that is provided on the photocatalyst-containing layer. On the other hand, when this layer is too thick, the transfer of holes or electrons is impeded, so that the light emission of the resulting EL device is adversely affected. It is therefore preferable to make the thickness of the photocatalyst-containing layer from 50 to 2000 angstroms, more preferably from 100 to 1000 angstroms.

The thickness of the photocatalyst-containing layer may be in the range between 50 angstroms and 2000 angstroms as mentioned above. In the first EL device shown in FIG. 2, the photocatalyst-containing layer 22 is effective for the pattern-wise formation of the luminous layer 23 on the photocatalyst-containing layer 22, and, at the same time, serves as a layer preventing continuity across the electrodes 21 and 24 because of its insulating properties. In EL devices, luminous layers are, in general, extremely thin as compared with two electrode layers. Therefore, there is such a problem that continuity across the two electrodes easily takes place, for example, due to irregularity of the electrode layers formed by vacuum deposition. Providing the wettability-changeable material layer can solve this problem. When the luminous efficiency of the luminous layer 23 is taken into consideration, it is necessary to ensure that charges can be injected from the electrodes 21, 24 to the luminous layer 23 when voltage is applied. It is therefore desirable to make the thickness of the wettability-changeable material layer not more than 1000 angstroms, which is the range of thickness that can make it possible to ensure the injection of charges. The thickness of the wettability-changeable material layer may be from 100 to 1000 angstroms. In the case where the luminous layer is formed pattern-wise on the electrode through a buffer layer and a charge-transfer layer as will be described later, these two layers may respectively be formed pattern-wise on the wettability-changeable material layer in the same manner as in the formation of the luminous layer. In this case, the thickness of the wettability-changeable material layer may be determined by taking the total thickness of the wettability-changeable material layer, the buffer layer and the charge-transfer layer, and the mobility of charges from the electrode to the luminous layer into consideration.

In Fourth Embodiment

In the fourth embodiment of the present invention, the photocatalyst-containing layer contains a substance capable of improving light emission properties.

When the photocatalyst-containing layer is too thin, a clear difference in wettability cannot be obtained, so that it is difficult to conduct the patterning of a layer that is provided on the photocatalyst-containing layer. On the other hand, when this layer is too thick, the transfer of holes or electrons is impeded, so that the light emission of the resulting EL device is adversely affected. Therefore, the thickness of the photocatalyst-containing layer is made preferably from 50 to 2000 angstroms, more preferably from 100 to 1000 angstroms.
(Principle of Change in Wettability)

In the present invention, a latent pattern due to the difference in wettability is formed on the photocatalyst-containing layer by utilizing a photocatalyst that can cause adjacent substances (binders, etc.) to chemically react when light is applied. Although it is not clear how the photocatalyst acts, it is considered that the wettability of the surface of the photocatalyst-containing layer changes because the chemical structures of the binders and the like are directly changed by those carriers produced in the photocatalyst when light is applied thereto, or changed by active oxygen species produced in the presence of oxygen and water.
(Photocatalyst Substance)

Examples of photocatalyst substances useful in the present invention include metallic oxides known as photo-semiconductors, such as titanium oxide ($TiO_2$), zinc oxide (ZnO), tin oxide ($SnO_2$).strontium titanate ($SrTiO_3$) .tungsten oxide ($WO_3$), bismuth oxide ($Bi_2O_3$), and iron oxide ($Fe_2O_3$). Of these, titanium oxide is particularly preferred. Titanium oxide is advantageous in that it has high band gap energy, is chemically stable, has no toxicity, and is readily available.

Although both anatase titanium oxide and rutile titanium oxide can be used as the photocatalyst in the present invention, anatase titanium oxide is preferred. Specific examples of useful anatase titanium oxides include an anatase titania sol of hydrochloric acid deflocculation type ("STS-02" manufactured by Ishihara Sangyo Kaisha, Ltd., Japan, average crystal size: 7 nm), and an anatase titania sol of nitric acid deflocculation type ("TA-15" manufactured by Nissan Chemical Industries, Ltd., Japan, average crystal size: 12 nm). These titanium oxides are advantageous because they are excited by light having a wavelength of not more than 380 nm.

It is preferable that the amount of the photocatalyst contained in the photocatalyst-containing layer be from 5 to 90% by weight, more preferably from 20 to 60% by weight.

It is preferable that the particle diameter of the photocatalyst be small because a photocatalyst having a smaller particle diameter can cause photocatalytic reaction more effectively. It is preferable to use a photocatalyst having an average particle diameter of not more than 50 nm, preferably of not more than 20 nm. In addition, when a photocatalyst having a smaller particle diameter is used, the resulting photocatalyst-containing layer has a smoother surface. When the surface roughness of the photocatalyst-containing layer exceeds 10 nm, the unexposed part of the photocatalyst-containing layer shows decreased water-repellency, and the exposed part cannot sufficiently reveal hydrophilic nature.
(Binder Component)

Binders that can be used for the photocatalyst-containing layer of the present invention are preferably such materials that their backbone structures are not decomposed thanks to their high bond energies even when the photo-excitation of the above-described photocatalysts occurs. Examples of such binders include (1) organopolysiloxanes having high strength, obtained by hydrolyzing and polycondensing chlorosilane, alkoxysilanes, or the like through sol-gel reaction or the like; and (2) organopolysiloxanes excellent in water- and oil-repellency, obtained by crosslinking reactive silicones.

The organopolysiloxanes (1) may chiefly be hydrolyzed-condensed or co-hydrolyzed products of one of or two or more of silicon compounds represented by the general formula $Y_nSiX_{4-n}$ (n=1 to 3). In this general formula, Y may be an alkyl or fluoroalkyl group, or vinyl, amino or epoxy group; and X may be halogen, or methoxyl, ethoxyl or acetyl group.

Specific examples of the organopolysiloxanes (1) include methyltrichlorosilane, methyltribromosilane, methyltrimethoxysilane, methyltriethoxysilane, methyltriisopropoxysilane, methyltri-t-butoxysilane; ethyltrichlorosilane, ethyltribromosilane, ethyltrimethoxysilane, ethyltriethoxysilane, ethyltriisopropoxysilane, ethyltri-t-butoxysilane; n-propyltrichlorosilane, n-propyltribromosilane, n-propyltrimethoxysilane, n-propyltriethoxysilane, n-propyltriisopropoxysilane, n-propyltri-t-butoxysilane; n-hexyltrichlorosilane, n-hexyltribromosilane, n-hexyltrimethoxysilane, n-hexyltriethoxysilane, n-hexyltriisopropoxysilane, n-hexyltri-t-butoxysilane; n-decyltrichlorosilane, n-decyltribromosilane, n-decyltrimethoxysilane, n-decyltriethoxysilane, n-decyltriisopropoxysilane, n-decyltri-t-butoxysilane; n-octadecyltrichlorosilane, n-octadecyltribromosilane, n-octadecyltrimethoxysilane, n-octadecyltriethoxysilane, n-octadecyltriisopropoxysilane, n-octadecyltri-t-butoxysilane; phenyltrichlorosilane, phenyltribromosilane, phenyltrimethoxysilane, phenyltriethoxysilane, phenyltriisopropoxysilane, phenyltri-t-butoxysilane; tetrachlorosilane, tetrabromosilane, tetramethoxysilane, tetraethoxysilane, tetrabutoxysilane, dimethoxydiethoxysilane; dimethyldichlorosilane, dimethyldibromosilane, dimethyldimethoxysilane, dimethyldiethoxysilane; diphenyldichlorosilane, diphenyldibromosilane, diphenyldimethoxysilane, diphenyldiethoxysilane; phenylmethyldicholorosilane, phenylmethyldibromosilane, phenylmethyldimethoxysilane, phenylmethyldiethoxysilane; trichlorohydrosilane, tribromohydrosilane, trimethoxyhydrosilane, triethoxyhydrosilane, triisopropoxyhydrosilane, tri-t-butoxyhydrosilane; vinyltrichlorosilane, vinyltribromosilane, vinyltrimethoxysilane, vinyltriethoxysilane, vinyltriisopropoxysilane, vinyltri-t-butoxysilane; trifluoropropyltrichlorosilane, trifluoropropyltribromosilane, trifluoropropyltrimethoxysilane, trifluoropropyltriethoxysilane, trifluoropropyltriisopropoxysilane, trifluoropropyltri-t-butoxysilane; γ-glycidoxypropylmethyldimethoxysilane, γ-glycidoxypropylmethyldiethoxysilane, γ-glycidoxypropyltriethoxysilane, γ-glycidoxypropyltriiethoxysilane, γ-glycidoxypropyltriisopropoxysilane, γ-glycidoxypropyltri-t-butoxysilane; γ-methacryloxypropylmethyl-dimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyltri-t-butoxysilane; γ-aminopropylmethyldimethoxysilane, γ-aminopropylmethyldiethoxysilane γ-aminopropyltrimethoxysilane, γ-aminopropyltriethoxysilane, γ-aminopropyltriisopropoxysilane, γ-aminopropyltri-t-butoxysilane; γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri-t-butoxysilane; β-(3,4-epoxycyclohexyl)ethyl-trimethoxysilane, and β-(3,4-epoxycyclohexyl)ethyltriethoxysilane; partially hydrolyzed products thereof; and mixtures thereof.

It is particularly preferable to use, as the binders, polysiloxanes containing fluoroalkyl groups. Specific examples of such polysiloxanes include hydrolyzed-condensed or co-hydrolyzed products of one of or two or more of the following fluoroalkylsilanes, and those polysiloxanes generally known as fluorine-containing silane coupling agents may also be used.

$CF_3(CF_2)_3CH_2CH_2Si(OCH_3)_3$
$CF_3(CF_2)_5CH_2CH_2Si(OCH_3)_3$
$CF_3(CF_2)_7CH_2CH_2Si(OCH_3)_3$
$CF_3(CF_2)_9CH_2CH_2Si(OCH_3)_3$
$(CF_3)_2CF(CF_2)_4CH_2CH_2Si(OCH_3)_3$
$(CF_3)_2CF(CF_2)_6CH_2CH_2Si(OCH_3)_3$
$(CF_3)_2CF(CF_2)_8CH_2CH_2Si(OCH_3)_3$
$CF_3(C_6H_4)C_2H_4Si(OCH_3)_3$
$CF_3(CF_2)_3(C_6H_4)C_2H_4Si(OCH_3)_3$
$CF_3(CF_2)_5(C_6H_4)C_2H_4Si(OCH_3)_3$
$CF_3(CF_2)_7(C_6H_4)C_2H_4Si(OCH_3)_3$
$CF_3(CF_2)_3CH_2CH_2SiCH_3(OCH_3)_2$
$CF_3(CF_2)_5CH_2CH_2SiCH_3(OCH_3)_2$
$CF_3(CF_2)_7CH_2CH_2SiCH_3(OCH_3)_2$
$CF_3(CF_2)_9CH_2CH_2SiCH_3(OCH_3)_2$
$(CF_3)_2CF(CF_2)_4CH_2CH_2SiCH_3(OCH_3)_2$
$(CF_3)_2CF(CF_2)_6CH_2CH_2SiCH_3(OCH_3)_2$
$(CF_3)_2CF(CF_2)_8CH_2CH_2SiCH_3(OCH_3)_2$
$CF_3(C_6H_4)C_2H_4SiCH_3(OCH_3)_2$
$CF_3(CF_2)_3(C_6H_4)C_2H_4SiCH_3(OCH_3)_2$
$CF_3(CF_2)_5(C_6H_4)C_2H_4SiCH_3(OCH_3)_2$
$CF_3(CF_2)_7(C_6H_4)C_2H_4SiCH_3(OCH_3)_2$
$CF_3(CF_2)_3CH_2CH_2Si(OCH_2CH_3)_3$
$CF_3(CF_2)_5CH_2CH_2Si(OCH_2CH_3)_3$
$CF_3(CF_2)_7CH_2CH_2Si(OCH_2CH_3)_3$
$CF_3(CF_2)_9CH_2CH_2Si(OCH_2CH_3)_3$
$CF_3(CF_2)_7SO_2N(C_2H_5)C_2H_4CH_2Si(OCH_3)_3$

When one of the above-described polysiloxanes having fluoroalkyl groups is used as the binder, the unexposed part of the resulting photocatalyst-containing layer has greatly increased water- and oil-repellency.

The above-described reactive silicones (2) include those compounds having backbone structures represented by the following general formula:

$$—(Si(R^1)(R^2)O)_n—$$

wherein n is an integer of 2 or more, and $R^1$ and $R^2$ are a substituted or unsubstituted alkyl, alkenyl, aryl or cyanoalkyl group having 1 to 10 carbon atoms. The reactive silicones may contain preferably not more than 40% of vinyl, phenyl or halogenated phenyl. Further, those reactive silicones in which $R^1$ and/or $R^2$ are methyl group are advantageous because such reactive silicones have minimum surface energy. Preferable reactive silicones are those ones containing 60% or more of methyl group, and, in their molecular chains, at least one reactive group such as hydroxyl group at their terminal ends or in side groups.

Together with the above-described organopolysiloxanes, stable organosilicon compounds such as dimethylpolysiloxane that do not cause crosslinking reaction may also be incorporated into the binder.

(Substance Capable of Improving Light Emission Properties—in Fourth Embodiment)

Any substance can be used as the substance capable of improving light emission properties that can be incorporated into the photocatalyst-containing layer in the EL device according to the fourth embodiment of the present invention as long as it can improve the light emission properties of the EL layer, for instance, a substance that facilitates the injection of holes or electrons to the EL layer such as the luminous layer. Unexpectedly, even if the substance capable of improving light emission properties is added to the photocatalyst-containing layer, the wettability of the photocatalyst-containing layer after exposed to light is scarcely affected.

In the case where the photocatalyst-containing layer is provided between the EL layer and the anode, those substances capable of improving hole-injection properties conventionally added to a hole-injection layer or an anode buffer layer in an EL layer are typically used as the substance capable of improving light emission properties. Examples of such substances include phenylamine compounds; starburst-type amine compounds; phthalocyanine compounds; oxides such as vanadium oxide, molybdenum oxide, ruthenium oxide, and aluminum oxide; amorphous carbon; polyaniline; and polythiophene derivatives. The substance capable of improving hole-injection properties is added in an amount of 10 to 90% by weight, more preferably 30 to 70% by weight so that the function of the photocatalyst-containing layer will not be impaired.

In the case where the photocatalyst-containing layer is provided between the EL layer and the anode, the following hole-transfer substances can effectively be used as the substance capable of improving light emission properties.

<Hole-Transfer Substances> Oxadiazole compounds, oxazole compounds, triazole compounds, thiazole compounds, triphenylmethane compounds, styryl compounds, pyrazoline compounds, hydrazone compounds, aromatic amine compounds, carbazole compounds, polyvinylcarbazole compounds, stylbene compounds, enamine compounds, azine compounds, triphenylamine compounds, butadiene compounds, polycyclic aromatic compounds, stylbene dimers, and the like. Butadiene, enamine, hydrazone and triphenylamine compounds are preferred because they have low ionization potentials. Hole-transfer substances include $\pi$-conjugated polymers such as polyacetylene, polydiacetylene, poly(p-phenylene), poly(p-phenylenesulfide), poly(p-phenyleneoxide), poly(1,6-heptadiyne), poly(p-phenylenevinylene), poly(2,5-thienylene), poly(2,5-pyrrole), poly(m-phenylenesulfide), and poly(4,4'-biphenylene). Examples of high-molecular-weight charge-transfer complexes include polystyrene.$AgClO_4$, polyvinylnaphthalene.TCNE, polyvinylnaphthalene.P-CA, polyphenylnaphthalene.DDQ, polyvinylmesitylene.TCNE, polynaphacetylene.TCNE, polyvinylanthracene.$Br_2$, polyvinylanthracene.$I_2$, polyvinylanthracene.TNB, polydimethylaminostyrene.CA, polyvinylimidazole.CQ, poly-p-phenylene$I_2$.poly-1-vinylpyridine.$I_2$, poly-4-vinylpyridine.$I_2$, poly-p-1-phenylene.$I_2$, and polyvinylpyridium.TCNQ. Further, examples of low-molecular-weight charge-transfer complexes include TCNQ-TTF, and examples of metal complex polymers include copper polyphthalocyanine. The hole-transfer substance is added to the photocatalyst-containing layer in an amount of 10 to 90% by weight, more preferably 30 to 70% by weight so that the function of the photocatalyst-containing layer will not be impaired.

In the case where the photocatalyst-containing layer is provided between the EL layer and the cathode, those substances capable of improving electron-injection properties, conventionally added to an electron-injection layer or a cathode buffer layer in an El layer are typically used as the substance capable of improving light emission properties. Examples of such substances include lithium aluminate, lithium fluoride, strontium, magnesium oxide, magnesium fluoride, strontium fluoride, potassium fluoride, barium fluoride, aluminum oxide, strontium oxide, calcium, polymethyl methacrylate, and sodium polystyrenesulfonate. The substance capable of improving electron-injection properties is added to the photocatalyst-containing layer in an amount of 10 to 90% by weight, preferably to 30 to 70% by weight so that the function of the photocatalyst-containing layer will not be impaired.

It is effective to add the following color-developing agents, which are added to a luminous layer in a conventional EL layer, to the photocatalyst-containing layer regardless of the position of the photocatalyst-containing layer provided.

<Dyestuff Type> Cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene cyclic compounds, pyridine cyclic compounds, perynone derivatives, perylene derivatives, oligothiophene derivatives, trifumanylamine derivatives, oxadiazole dimers, and pyrazoline dimers.

<Metal Complex Type> Metal complexes, such as quinolinol aluminum complexes, benzoquinolinol beryllium complexes, benzoxazole zinc complexes, benzothiazole zinc complexes, azomethyl zinc complexes, porphyrin zinc complexes, and europium complexes, having Al, Zn, Be, etc. or rare earth metals such as Tb, Eu and Dy as central metals, and oxadiazole, thiadiazole, phenyl pyridine, phenyl benzimidazole and quinoline structures, etc. as ligands.

<Polymer Type> Polyparaphenylene vinylene derivatives, polythiophene derivatives, polyparaphenylene derivatives, polysilane derivatives, polyacetylene derivatives, polyvinyl carbazole, and polyfluorene derivatives.

If used, the color-developing substance is added to the photocatalyst-containing layer in an amount of 10 to 90% by weight, preferably 30 to 70% by weight so that the function of the photocatalyst-containing layer is not impaired.

It is also effective to add the following doping substances to the photocatalyst-containing layer regardless of the position of the photocatalyst-containing layer provided.

<Doping Substances> Perylene derivatives, coumarin derivatives, rubrene derivatives, quinacridone derivatives, squarium derivatives, porphyrin derivatives, styryl-based colorants, tetracene derivatives, pyrazoline derivatives, decacyclene, and phenoxazone.

If used, the doping substance is added to the photocatalyst-containing layer in an amount of 10 to 90% by weight, more preferably 30 to 70% by weight so that the function of the photocatalyst-containing layer will not be impaired.

<Metal Salts>

The following metal salts are also effective as the substance capable of improving light emission properties: $FeCl_2$, $FeCl_3$, $Cr(NO_3)_3$, $CrCl_3$, $NaNO_3$, $Ca(NO_3)_2$, $Sr(NO_3)_2$, $Co(NO_3)_2$, $CoCl_2$, $Cd(NO_3)_2$, $Mg(NO_3)_2$, $Cu(CH_3COO)_2$, $Cu(NO_3)_2$, $Ni(NO_3)_2$, $Mn(NO_3)_2$, $MnCl_2$, $PbNO_3$, $RuCl_3$, $IrCl_4$, $Ir(NO_3)_3$, $ScCl_3$, $Sc(NO_3)_3$, $H_2PtCl_6$, $RhCl_3$, $Tb(NO_3)_3$, $Pr(NO_3)_3$, $Dy(NO_3)_3$, $Sm(NO_3)_3$, $Ga(NO_3)_3$, $Gb(NO_3)_3$, $Yb(NO_3)_3$, $NbCl_5$, $ZrCl_4$, $Zr(NO_3)_2$, $KNO_3$, $LiNO_3$, $HAsCl_4$, $Pd(NO_3)_2$, $Eu(NO_3)_2$, $Nd(NO_3)_2$, $NiCl_3$, $Ce(NO_3)_3$, $CsNO_3$, $Er(NO_3)_3$, $Ba(NO_3)_2$, $La(NO_3)_3$, $AgCl$, $CH_3CH(OH)COOAg$, $AgNO_3$, $TlNO_3$, $Y(NO_3)_3$, $Pb(NO_3)_2$, $Ho(NO_3)_3$, and $Bi(NO_3)_3$. It is effective to add the metal salt to the photocatalyst-containing layer in an amount of 0.01 to 50% by weight, preferably 0.1 to 10% by weight of the total amount of the titanium oxide and the binder in the photocatalyst-containing layer.

(Other Components for Use in Photocatalyst-Containing Layer)

Surface-active agents may be added to the photocatalyst-containing layer for use in the present invention in order to decrease the wettability of the unexposed part of the photocatalyst-containing layer. Any surface-active agent is useful as long as it can be decomposed by the photocatalyst, and removed. Specifically, useful surface-active agents preferably include a series of hydrocarbon-based surface-active agents, NIKKOL BL, BC, BO and BB manufactured by Nihon Surfactant Kogyo K.K., Japan; and fluorine-containing or silicone-based nonionic surface-active agents such as ZONYL FSN and FSO manufactured by Du Pont Inc., Surfluon S-141 and S-145 manufactured by Asahi Glass Co., Ltd., Japan, Megafac F-141 and F-144 manufactured by Dainippon Ink & Chemicals, Inc., Japan, Ftergent F-200 and F-251 manufactured by NEOS Company Limited, Japan, Unidyne DS-401 and DS-402 manufactured by Daikin Industries, Ltd., Japan, and Fluorad FC-170 and FC-176 manufactured by 3M Corporation. In addition, cationic, anionic or ampholytic surface-active agents may also be used.

The photocatalyst-containing layer for use in the present invention may contain other components, for example, oligomers or polymers such as polyvinyl alcohol, unsaturated polyesters, acrylic resins, polyethylene, diallyl phthalate, ethylene-propylene-diene monomers, epoxy resins, phenolic resins, polyurethane, melamine resins, polycarbonate, polyvinyl chloride, polyamide, polyimide, styrene-butadiene rubber, chloroprene rubber, polypropylene, polybutylene, polystyrene, polyvinyl acetate, nylon, polyesters, polybutadiene, polybenzimidazole, polyacrylonitrile, epichlorohydrin, polysulfide, and polyisoprene.

The photocatalyst-containing layer for use in the present invention may contain sensitizing dyes capable of increasing the photoactivity of the photocatalyst. When such sensitizing dyes are added, the photocatalyst-containing layer undergoes change in wettability even when light is applied thereto in a small exposure, or when light of a wavelength different from the predetermined one is applied to the layer.
(Method of Forming Photocatalyst-Containing Layer)

The photocatalyst-containing layer can be formed by any method. This layer may be formed by applying a coating liquid containing a photocatalyst to a substrate by any one of spin coating, spray coating, dip coating, roll coating, bead coating, and the like.

Any solvent can be used for preparing the coating liquid containing a photocatalyst; and an alcoholic organic solvent such as ethanol or isopropanol can be used, for instance.

In the case where the coating liquid contains an ultraviolet-curing component as the binder, the formation of the photocatalyst-containing layer can also be attained by curing treatment, that is, by the application of ultraviolet light.
(Light for Activating Photocatalyst)

Any light can be used to activate the photocatalyst as long as it can excite the photocatalyst. Examples of such light include ultraviolet light, visible light, and infrared light. In addition, electromagnetic waves and radiation whose wavelengths are either shorter or longer than that of ultraviolet, visible or infrared light can also be used.

In the case where anatase titania is used as the photocatalyst, it is possible to excite the photocatalyst by the use of ultraviolet light because anatase titania is excited by light having a wavelength of not more than 380 nm. Any of mercury vapor lamps, metal halide lamps, xenon lamps, excimer lasers, and other sources of ultraviolet light can be used herein as the source of ultraviolet light.

Another Layer of Material whose Wettability Changes when Light Is Applied Thereto Besides the above-described photocatalyst-containing layer, a polymeric organic resin layer can be used as the layer of a material whose wettability changes when light is applied thereto. The polymer chains of such organic polymers as polycarbonate, polyethylene, polyethylene terephthalate, polyamide and polystyrene are broken when ultraviolet light, especially ultraviolet light chiefly containing rays of shorter wavelengths of 250 nm or less, is applied, and the molecular weights of these polymers are thus decreased. For this reason, when ultraviolet light is applied to the surface of a resin layer made from one of these polymers, the surface becomes rough, and undergoes change in wettability. As a result, the resin layer becomes highly hydrophilic, that is, compatible with a material to be laminated thereto. By utilizing this phenomenon, it is possible to create a great difference in wettability between the exposed part and the unexposed part of the resin layer, and to increase the compatibility with the laminating material. It becomes thus possible to successfully conduct the patterning of the laminating material.
EL Layer Any El layer can be provided in the EL device of the present invention as long as it can cause electroluminescence. The EL layer is provided on the first electrode (between the first electrode and the second electrode); it may be provided on the first electrode either directly or through the photocatalyst-containing layer or any other necessary layers.

The EL layer for use in the present invention comprises a luminous layer as an essential component, and, as optional layers, a hole-transfer layer which serves to transfer holes to the luminous layer, and an electron-transfer layer which serves to transfer electrons to the luminous layer (these two layers are sometimes collectively referred to as charge-transfer layer). In addition, the EL layer can also optionally include a hole-injection layer which serves to inject holes to the luminous layer or to the hole-transfer layer, and an electron-injection layer which serves to inject electrons to the luminous layer or to the electron-transfer layer (these two layers are sometimes collectively referred to as charge-injection layer).

Materials for forming the above-described constitution layers of the EL layer include the following compounds.
(Luminous layer)

<Coloring Matter> Cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene cyclic compounds, pyridine cyclic compounds, perynone derivatives, perylene derivatives, oligothiophene derivatives, trifumanylamine derivatives, oxadiazole dimers, and pyrazoline dimers.

<Metal Complexes> Metal complexes, such as quinolinol aluminum complexes, benzoquinolinol beryllium complexes, benzoxazole zinc complexes, benzothiazole zinc complexes, azomethyl zinc complexes, porphyrin zinc complexes, and europium complexes, having Al, Zn, Be, etc. or rare earth metals such as Tb, Eu and Dy as central metals, and oxadiazole, thiadiazole, phenylpyridine, phenyl benzimidazole and quinoline structures, etc. as ligands.

<Polymers> Polyparaphenylene vinylene derivatives, polythiophene derivatives, polyparaphenylene derivatives, polysilane derivatives, polyacetylene derivatives, polyvinyl carbazole, and polyfluorene derivatives.
(Doping Substances)

Perylene derivatives, coumarin derivatives, rubrene derivatives, quinacridone derivatives, squarium derivatives, porphyrin derivatives, styryl-based colorants, tetracene derivatives, pyrazoline derivatives, decacyclene, and phenoxazone.

(Hole-Injection Layer (Anode Buffer Materials))

Phenylamine compounds; star-burst-type amine compounds; phthalocyanine compounds; oxides such as vanadium oxide, molybdenum oxide, ruthenium oxide, and aluminum oxide; amorphous carbon; polyaniline; and polythiophene derivatives.

(Electron-Injection Layer (Cathode Buffer Materials))

Lithium aluminate, lithium fluoride, strontium, magnesium oxide, magnesium fluoride, strontium fluoride, potassium fluoride, barium fluoride, aluminum oxide, strontium oxide, calcium, polymethyl methacrylate, and sodium polystyrenesulfonate.

(Materials for Partitioning Layer in EL Layer)

A partitioning layer may be provided in the EL layer. This layer is particularly effective when EL layers that emit light of different colors are used in combination. Examples of materials useful for forming the partitioning layer include photosensitive polyimide resins, acrylic resins, photosetting resins, thermosetting resins, and water-repellent resins.

First Electrode and Second Electrode

In this specification, an electrode that is firstly formed is called "first electrode", and an electrode that is formed on the EL layer is called "second electrode". There is no particular limitation on these electrodes. It is however preferable that these electrodes be anode and cathode; in this case, the first electrode may be either anode or cathode. Either one of anode and cathode is transparent or semitransparent. If it is transparent, the resulting EL device is a direct-view EL device. If one of the electrodes is made reflective, the resulting EL device is a reflection type EL device.

It is preferable to use, to make anode, a conductive material having great work function so that holes can easily be injected into the anode, while it is preferable to use, to make cathode, a conductive material having low work function so that electrons can easily be injected into the cathode. Mixtures of a plurality of conductive materials can also be used to make the electrodes. For both electrodes, it is preferable to use materials having resistances as low as possible. In general, metallic materials are used to make the electrodes; however, organic or inorganic compounds may also be used. Preferred examples of materials for anode include ITO, indium oxide, gold and polyaniline; examples of materials for cathode include magnesium alloys (MgAg, etc.), aluminum alloys (AlLi, AlCa, AlMg, etc.), and metallic calcium.

To form the first and second electrodes, materials for the electrodes are deposited through respective electrode pattern masks so that the two electrodes deposited will have thicknesses between 10 nm and 1 $\mu$M and that their patterns will be orthogonal to each other. When the two electrodes are formed in this manner, the resulting EL device is a simple-matrix-addressed EL device. Further, when the electrodes are provided on a substrate having a thin-film transistor, an active-matrix-addressed EL device can be obtained.

Substrate

In the present invention, the substrate is one on which the electrodes and the EL layer will be provided, and may be made of a transparent or opaque material. In the EL device of the present invention, although the substrate may be the first electrode itself, the first electrode is, in general, provided on the surface of the substrate either directly or through an intermediate layer in order to maintain strength.

The substrate may be in the form of plate, film or bulk; and a glass plate, for instance, may be used as the substrate. Any material can be used for the substrate as long as it can support the EL device.

Insulating Layer—in Third Embodiment & Fourth Embodiment

In a preferred embodiment of the EL device of the present invention, at least one insulating layer can partially be formed on the photocatalyst-containing layer. It is preferable that the insulating layer be made from a material containing a photosetting resin such as an ultraviolet-curing resin, or a thermosetting resin. This insulating layer blocks the supply of charges from the electrode to the EL layer, so that it forms a non-luminous part.

In the present invention, the use of an ultraviolet-curing resin for the formation of the insulating layer is advantageous in production process. For example, when, after applying light pattern-wise to the photocatalyst-containing layer, a material for forming the insulating layer is applied only to a part of the photocatalyst-containing layer that shows increased wettability because of the light applied, and the entire surface is then exposed to ultraviolet light, the insulating layer is cured, and, at the same time, a part of the photocatalyst-containing layer on which the insulating layer is not formed has increased wettability. After this, the EL layer may further be formed on the photocatalyst-containing layer. At this time, the EL layer may be formed only on the part of the photocatalyst-containing layer on which the insulating layer is not present (that is, the EL layer may be formed only on the exposed part of the photocatalyst-containing layer). Alternatively, the EL layer may be formed on the entire surface of the photocatalyst-containing layer (that is, the EL layer may be formed on the part of the photocatalyst-containing layer on which the insulating layer is not present, and on the insulating layer formed on the photocatalyst-containing layer). The selection of a proper manner for the formation of the EL layer depends on the desired product, production cost, and the like.

Production Process

First Embodiment

According to the present invention, a process for producing an EL device in which an EL layer is provided on a photocatalyst-containing layer comprises the steps of forming a first electrode on a substrate, forming a photocatalyst-containing layer on the first electrode, subjecting the photocatalyst-containing layer to pattern-wise exposure to light to form thereon a latent pattern due to the difference in wettability, applying an EL-layer-forming coating liquid to the exposed part of the photocatalyst-containing layer to form a patterned EL layer, and forming a second electrode on the EL layer.

An EL device of the present invention in which a first electrode is provided on a photocatalyst-containing layer can be produced by a process similar to the above one, provided that the process comprises the steps of forming, instead of the first electrode, a photocatalyst-containing layer on the substrate, and applying a first-electrode-forming coating liquid to the exposed part of the photocatalyst-containing layer to form a patterned first electrode.

An EL device of the present invention in which a second electrode is provided on a photocatalyst-containing layer can be produced by a process similar to the above one, provided that the process comprises the steps of forming a photocatalyst-containing layer on the EL layer formed on the first electrode, and applying a second-electrode-forming coating liquid to the exposed part of the photocatalyst-containing layer to form a patterned second electrode.

Furthermore, those layers other than the photocatalyst-containing layer and a layer to be formed thereon may be formed by any of processes employable for producing conventional EL devices.

Solvents for use in coating liquids that are used for forming layers on the photocatalyst-containing layer, for example, the EL-layer-forming coating liquid, the first-electrode-forming coating liquid and the second-electrode-forming coating liquid (collectively referred to as coating liquid) are preferably polar solvents such as water. Coating liquids prepared by using polar solvents have high wettability against the exposed part of the photocatalyst-containing layer, but are repelled by the unexposed part of the same. Such coating liquids are therefore advantageous from the viewpoint of the patterning of the coating liquid layers.

The coating liquid can be applied to the photocatalyst-containing layer by such a method as spin coating, ink-jetting, dip coating or blade coating, or by dropping the coating liquid on the photocatalyst-containing layer.

The patterning of the EL layer, the first electrode, the second electrode, or the like that is formed on the photocatalyst-containing layer can be effected before the coating liquid applied is not solidified. Alternatively, the patterning of such a layer can also be effected, after the coating liquid is solidified to form the layer, by stripping only a part of the layer that has adhered to the low-wettability part of the photocatalyst-containing layer. Specifically, the patterning of any of the above layers can be effected, for example, by a method in which a substrate coated with the coating liquid is inclined before the coating liquid is solidified, a method in which air is blown, or a method in which an adhesive tape is adhered to the coating liquid solidified, and then peeled off.

In the case where the EL device of the present invention is a full-color display, it is preferable to make picture elements on the display so that they correspond to the latent pattern due to the difference in wettability, formed on the photocatalyst-containing layer.

Second Embodiment

The method for forming a luminous layer on a wettability-changeable material layer includes an ink jet process, a process in which a luminous material is applied pattern-wise by printing, and a vacuum deposition process. In the case of an ink jet or printing process, the wettability-changeable material layer is exposed to light correspondingly to a pattern that defines the position of a luminous layer of a single color, or luminous layers of R, G and B to be formed. Thereafter, ink of a desired color, or inks of R, G and B are applied pattern-wise by means of an ink-jetting apparatus or printing machine. The unexposed part of the wettability-changeable material layer repels the ink or inks, so that it is possible to accurately adhere pattern-wise the ink of each color to the wettability-changeable material layer. Thereafter, the conventional procedure for producing an EL device may be employed to obtain an EL device excellent in pattern accuracy.

Since the exposed part of the wettability-changeable material layer has increased wettability, the ink spreads on this part of the layer uniformly. The film of the ink thus has a thickness improved in evenness.

In general, a high-molecular-weight material is applied by such a coating method as ink jetting, coating, or pattern printing, while a low-molecular-weight material is applied by vacuum deposition. However, a low-molecular-weight material dispersed in a resin or the like may be applied by any of the above coating methods to form a film as in the formation of a film of a high-molecular-weight material. Further, a high-molecular-weight material may be laminated by vacuum deposition.

Ink of a single color or inks of the three colors of R, G and B may be uniformly applied to the wettability-changeable material layer. In the case of the three colors of R, G and B, a wettability-changeable material layer is firstly exposed to light according to a pattern that defines the position of a luminous layer of either one of the three colors to be formed. Thereafter, the wettability-changeable material layer is dip-coated with ink of this color. The unexposed part of the wettability-changeable material layer repels the ink, so that the luminous layer of this color can be formed pattern-wise. Next, after uniformly forming a wettability-changeable material layer on this, the layer is exposed to light according to a pattern that defines the position of a luminous layer of a second color to be formed, and the luminous layer of the second color is pattern-wise formed in the same manner as the above. Lastly, after uniformly forming a wettability-changeable material layer on this, the layer is exposed to light according to a pattern that defines the position of a luminous layer of a third color to be formed, and the luminous layer of the third color is pattern-wise formed in the same manner as the above. Thus, the luminous layers of the three colors of R, G and B can be alternately formed, and an EL device excellent in pattern accuracy can be obtained.

A luminous layer of a single color or those of the three colors of R, G and B may also be formed by homogeneous deposition. This method utilizes such a fact that a part of the luminous layer that is deposited on the unexposed part of the wettability-changeable material layer can easily be stripped by the use of an adhesive tape or the like because the bonding strength between the exposed part of the wettability-changeable material layer and the luminous layer deposited thereon is high, while the bonding strength between the unexposed part of the same and the luminous layer deposited thereon is low. In the case where luminous layers of the three colors of R, G and B are formed by deposition, these layers can successfully be formed in a manner similar to the above-described uniform coating process, and EL device excellent in pattern accuracy can be obtained.

To form a luminous layer by an ink-jetting, pattern-printing or uniform coating process, a material for forming the luminous layer in the form of an aqueous solution, an organic solvent solution, or the like is used. To form a luminous layer by vacuum deposition, almost all low-molecular-weight materials can be used although high-molecular-weight materials may also be used. The thickness of the luminous layer is from 1 nm to 2 $\mu$m, preferably from 10 nm to 200 nm.

Figure 8:
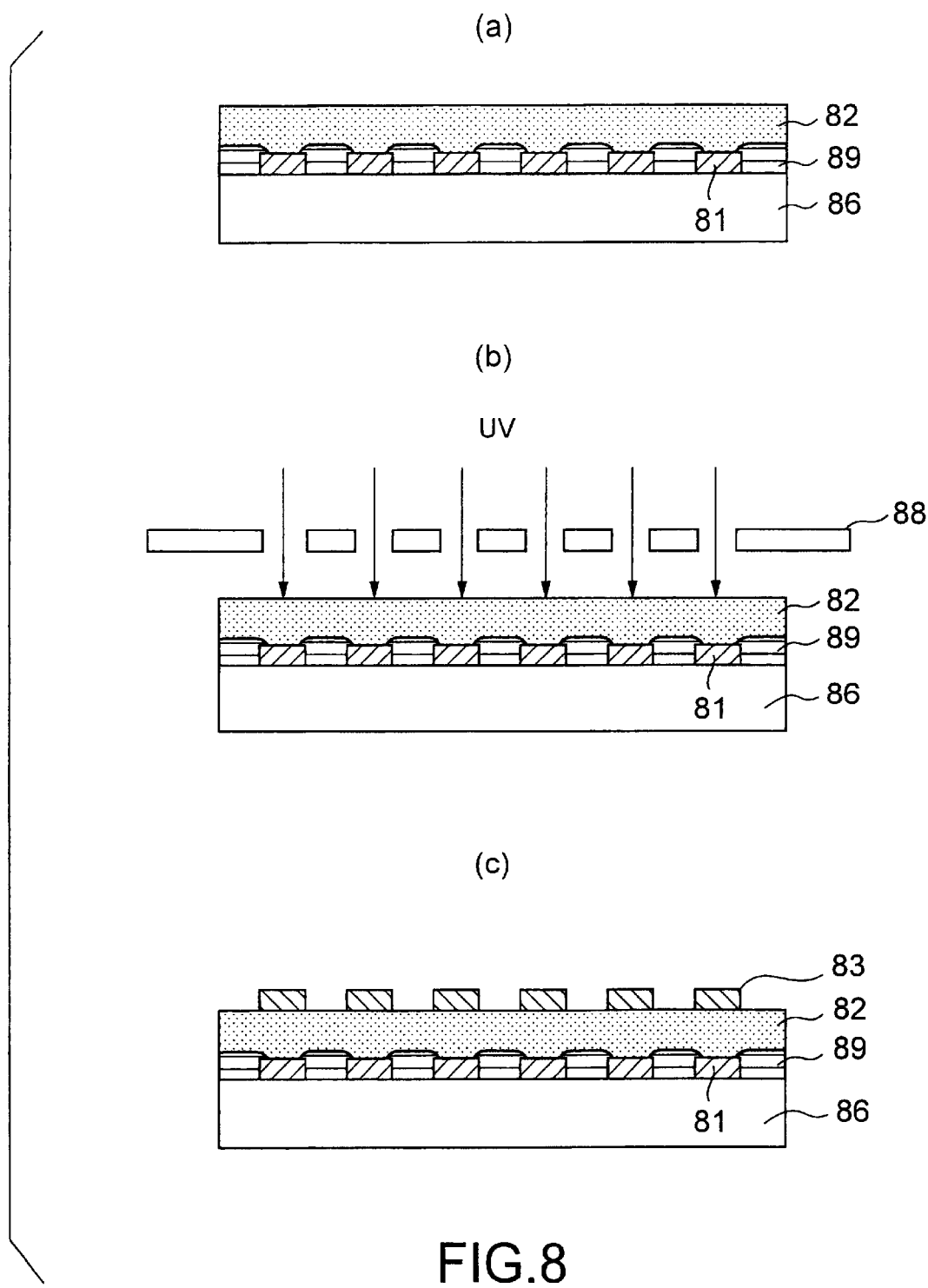
FIG. 8 is a cross-sectional view for illustrating one process for producing an EL device according to the present invention.

Next, the process for producing the first EL device according to the second embodiment of the present invention will now be described by referring to FIG. 8. To produce the first EL device, a wettability-changeable material layer is, first of all, uniformly laminated to a patterned electrode 81 by a uniform coating process as shown in FIG. 8 (*a*). The wettability-changeable material layer is then exposed to ultraviolet light through a mask having the same pattern as that of the electrode, or a mask having openings, each having a width that is the same as or larger than that of the protrusion in the patterned electrode. A part of the wettability-changeable material layer that corresponds to the border of the patterned electrode thus becomes an exposed part. It is herein preferable to cover, with an insulating layer 89, the edges of the border of the patterned electrode 81 and the parts between the borders of the same in order to prevent short circuit between the borders of the patterned electrode 81

Subsequently, a luminous layer is laminated to the wettability-changeable material layer by an ink-jetting process, or the like. In the case where the luminous layer is laminated by using a coating liquid, the unexposed part of the wettability-changeable material layer repels the coating liquid applied thereto, so that the luminous layer is accurately laminated only to the exposed part of the wettability-changeable material layer that corresponds to the border of the patterned electrode. On the other hand, when a luminous layer is formed by vacuum deposition or entire-surface coating, the luminous layer deposited on the unexposed part can be stripped and removed by using an adhesive tape or the like. Lastly, although not shown in this figure, a counter electrode is formed pattern-wise by deposition so that the pattern of this electrode and that of the electrode 81 will be orthogonal to each other. The first EL device can thus be produced.

Figure 9:
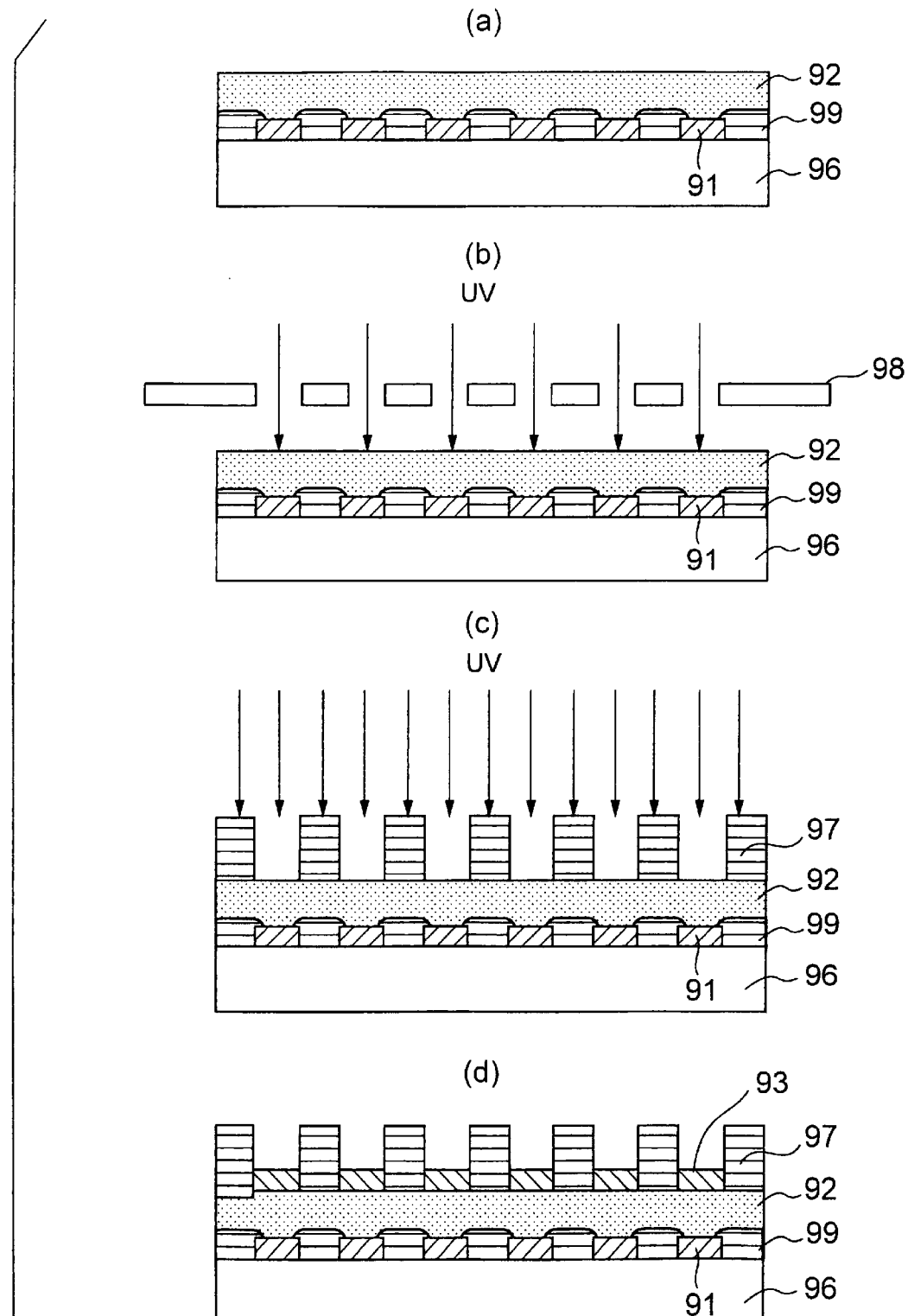
FIG. 9 is a cross-sectional view for illustrating one process for producing an EL device according to the present invention.

By referring to FIG. 9, the process for producing the second EL device according to the second embodiment of the present invention will be described. To produce the second EL device, a wettability-changeable material layer is exposed to ultraviolet light through a mask having the negative pattern of the electrode pattern, or a mask having openings, each having a width smaller than the spacing between the borders of the patterned electrode as shown in FIG. 9 (b). A part of the wettability-changeable material layer that corresponds to the part between the borders of the patterned electrode becomes an exposed part. It is herein preferable to cover, with an insulating layer 99, the edges of the border of the patterned electrodes 91 and the parts between the borders of the same in order to prevent short circuit between the borders of the patterned electrode 91.

Subsequently, a partitioning layer is pattern-wise laminated to the wettability-changeable material layer by an ink-jetting process or the like. In the case where the partitioning layer is laminated by a coating process, the unexposed part of the wettability-changeable material layer repels the material for forming the partitioning layer, so that this material accurately adheres only to the exposed part. On the other hand, when the partitioning layer is formed by deposition, it is favorable to use an adhesive tape or the like to strip the partitioning layer deposited on the unexposed part of the wettability-changeable material layer.

As shown in FIG. 9 (c), a part of the wettability-changeable material layer that corresponds to the border of the patterned electrode is changed to an exposed part by the application of ultraviolet light. A luminous layer is then laminated by an ink jet process or the like to the exposed part of the wettability-changeable material layer, between the borders of the partitioning layer as shown in FIG. 9 (d).

Lastly, although not shown in this figure, a counter electrode is formed pattern-wise by deposition so that the pattern of this electrode and that of the electrode 91 will be orthogonal to each other. The second EL device can thus be produced.

Figure 10:
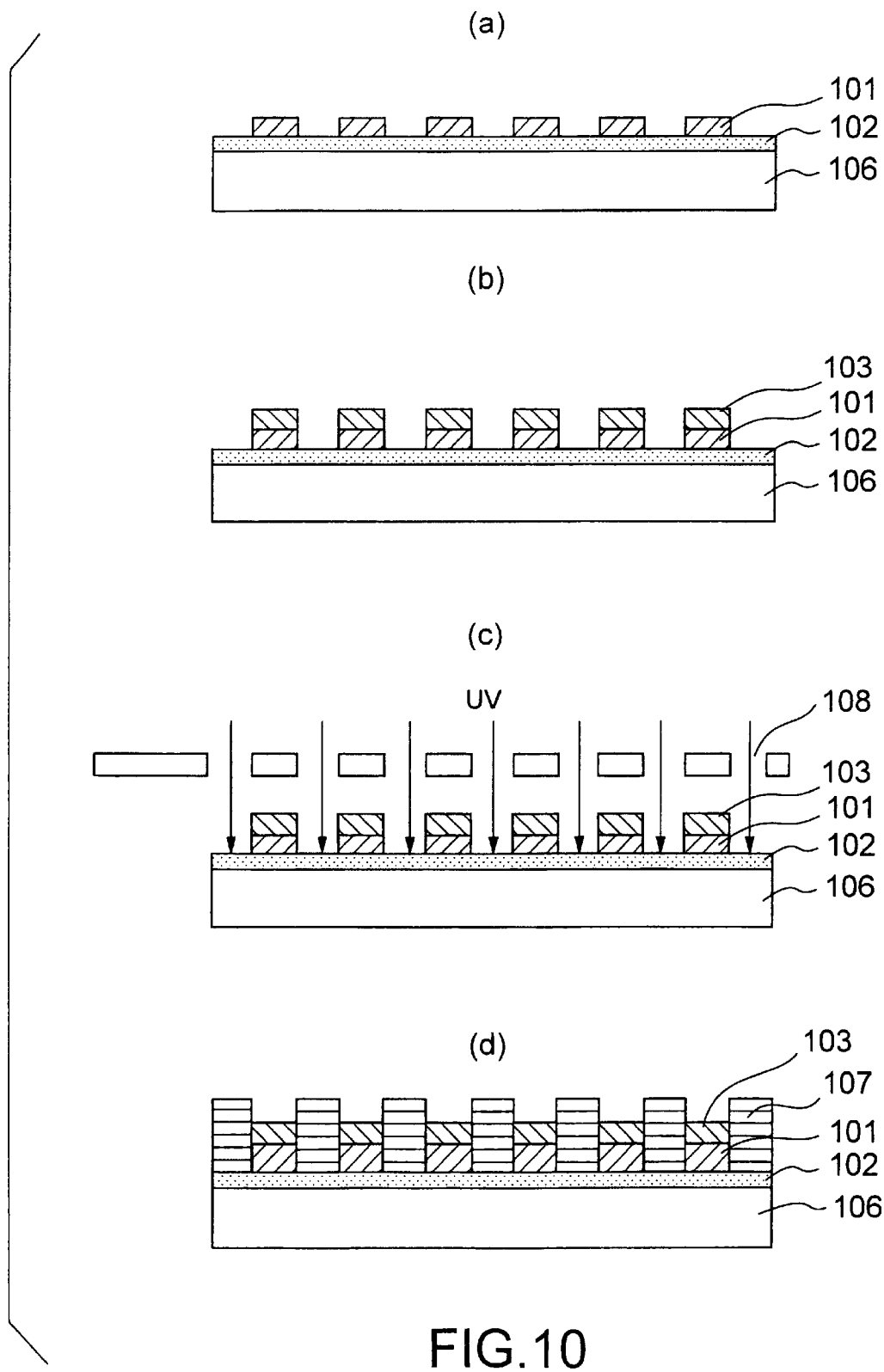
FIG. 10 is a cross-sectional view for illustrating one process for producing an EL device according to the present invention.

By referring to FIG. 10, the process for producing the third device according to the second embodiment of the present invention will be described. To produce the third EL device, a wettability-changeable material layer 102 is firstly applied to a substrate 106, and an electrode is then formed pattern-wise on the layer 102 as shown in FIG. 10 (a). At this time, it is preferable to apply light, in advance, to a part of the wettability-changeable material layer on which the electrode 101 is supposed to be formed. Subsequently, after laminating a luminous layer to the patterned electrode by an ink jet process or the like as shown in FIG. 10 (b), a part of the wettability-changeable material layer that is between the borders of the patterned electrode is changed to an exposed part by the application of light through a mask. Thereafter, a partitioning layer is laminated to the exposed part by an ink jet process or the like as shown in FIG. 10 (d). Lastly, although not shown in this figure, a counter electrode is formed pattern-wise by deposition so that the pattern of this electrode and that of the electrode 101 will be orthogonal to each other. The third EL device can thus be produced.

Third Embodiment

The characteristic feature of the process for producing the EL device according to the third embodiment of the present invention is as follows: a latent pattern due to the difference in wettability is formed on a photocatalyst-containing layer by the application of light, and an EL or insulating layer is then formed on the high-wettability part of the photocatalyst-containing layer by utilizing this latent pattern, thereby obtaining an EL device capable of displaying, by the emission of light, a pattern that is different from the electrode pattern.

A specific embodiment is a process for producing an EL device that comprises two facing electrodes and an EL layer provided between them, comprising the steps of forming a photocatalyst-containing layer on one of the electrodes, exposing pattern-wise the photocatalyst-containing layer to light to form thereon a latent pattern due to the difference in wettability, forming at least one of a charge-injection layer, a charge-transfer layer and a luminous layer on the exposed part of the photocatalyst-containing layer, and forming the other electrode.

Another embodiment is a process comprising the steps of forming a latent pattern due to the difference in wettability on a photocatalyst-containing layer, forming an insulting layer on the exposed part of the photocatalyst-containing layer, forming an EL layer on a part of the photocatalyst-containing layer on which the insulating layer is not formed, or on both the photocatalyst-containing layer and the insulating layer provided thereon after exposing the entire surface of the photocatalyst-containing layer to light, and forming the other electrode.

A further embodiment is a process comprising the steps of forming a latent pattern due to the difference in wettability on a photocatalyst-containing layer, forming an insulating layer on the exposed part of the photocatalyst-containing layer by the use of an ultraviolet-curing resin, applying ultraviolet light to the entire surface of the photocatalyst-containing layer provided with the insulating layer, forming at least one of a charge-injection layer, a charge-transfer layer and a luminous layer, and forming the other electrode.

To form the EL layer or insulating resin layer on the latent pattern formed on the photocatalyst-containing layer in the above-described processes, a material for forming the EL layer or the insulating resin layer may be adhered pattern-wise to the photocatalyst-containing layer by ink jetting or vacuum deposition. Typically, in this case, patterning is conducted upon the application of the material to the photocatalyst-containing layer. It is however also possible to adopt, if desired, such a manner that a pattern is formed by removing a part of the coating liquid layer that is on the low-wettability part of the photocatalyst-containing layer, by applying physical or chemical energy to the photocatalyst-containing layer either after or before its solidification. To effect the above removal, stripping by the use of an adhesive tape, or etching may be useful.

Typically, the above-described processes are employed to produce the EL devices of the present invention. It is however acceptable to produce them by a process different from the above ones. Moreover, an EL device having a structure that can be attained only by a process different from the above-described ones is also acceptable. For example, other layers may be laminated between the electrode and the photocatalyst-containing layer.

Fourth Embodiment

An EL device of the present invention in which a photocatalyst-containing layer is provided between a plurality of EL layers can be produced by a process similar to that for producing the EL device of the first embodiment, provided that the process comprises the steps of forming a photocatalyst-containing layer not on the first electrode but on a first EL layer, and applying a second-EL-layer-forming coating liquid to the exposed part of the photocatalyst-containing layer to form pattern-wise a second EL layer and that the photocatalyst-containing layer contains a substance capable of improving light emission properties.

An EL device of the present invention in which an insulating layer is provided on a photocatalyst-containing layer can be produced by a process similar to that for producing the EL device of the first embodiment, provided that the process comprises the step of applying an insulating-layer-forming coating liquid to the exposed part of the photocatalyst-containing layer, and curing the coating liquid by drying, heating or applying light to from pattern-wise an insulating layer on the photocatalyst-containing layer and that the photocatalyst-containing layer contains a substance capable of improving light emission properties.

There can also be obtained other devices by processes similar to that for producing the EL device of the first embodiment, provided that a substance capable of improving light emission properties is incorporated into the photocatalyst-containing layer.

Effects

The present invention provides an EL device that can simply be produced and a process for producing the EL device.

The EL device of the present invention contains a luminous layer excellent in pattern accuracy, shows excellent displaying properties, and is free from continuity across the electrodes.

Furthermore, the present invention provides a simple process for producing an EL device capable of displaying a pattern by the emission of light, and an EL device that can be produced through the process.

In addition, the present invention provides an EL device having excellent light emission properties, characterized in that the patterning of its constituent layers can easily be made, and a process for producing such an EL device.

EXAMPLES

The present invention will now be explained more specifically by referring to the following Examples. Examples A, B, C and D correspond to the first, second, third and fourth embodiments of the present invention, respectively.

Example A-1-1

A photocatalyst-containing-layer-forming coating liquid and an EL-layer-forming coating liquid having the following compositions were respectively prepared.
(Photocatalyst-Containing-Layer-Forming Coating Liquid A-1)

| | |
|---|---|
| Anatase Titania Sol (ST-K03 manufactured by Ishihara Sangyo Kaisha, Ltd., Japan) | 6 parts by weight |
| Fluoroalkoxysilane (MF-160E manufactured by TOHKEM PRODUCTS CORPORATION, Japan) | 1.26 parts by weight |
| 1N Hydrochloric acid | 12 parts by weight |
| Isopropyl alcohol | 58.5 parts by weight |

(Formation of Photocatalyst-Containing Layer, and Confirmation of Change in Wettability)

The above-prepared photocatalyst-containing-layer-forming coating liquid was applied to a cleaned glass substrate by means of a spin coater, and dried at 150° C. for 10 minutes to carry out hydrolysis and polycondensation reaction, thereby forming a 20-nm thick transparent photocatalyst-containing layer in which the photocatalyst was firmly fixed in the organosiloxane.

Light (wavelength: 365 nm) emitted from a mercury vapor lamp was applied, through a mask, to the photocatalyst-containing layer with an illumination intensity of 70 mW/cm$^2$ for 50 seconds. The contact angel with water of the exposed part of the photocatalyst-containing layer and that of the unexposed part of the same were measured by the use of a contact angle meter (CA-Z type, manufactured by Kyowa Interface Science Co. LTD, Japan). The measurement was carried out 30 seconds after water was dropped from a micro-syringe to the surface of the photocatalyst-containing layer. The results were as follows: the contact angle with water of the unexposed part was 142°, while that of the exposed part was not more than 10°. It was thus confirmed that it was possible to form, on the photocatalyst-containing layer, a latent pattern due to the difference in wettability between the exposed part and the unexposed part.
(EL-Layer-Forming Coating Liquid A-1)

| | |
|---|---|
| Polyvinyl carbazole (Lot. K81127 manufactured by Anan Corporation, Japan) | 70 parts by weight |
| Oxadiazole compound (manufactured by Wako Pure Chemical Industries, Inc., Japan) | 30 parts by weight |
| Coumarin 6 (manufactured by Aldrich Chemical Corporation) | 1 part by weight |
| 1,2-Dichloroethane (manufactured by Junsei Chemical Co., Ltd., Japan) | 3367 part by weight |

To an ITO glass substrate provided with a line pattern with a line spacing of 24 μm and a line width of 162 μm, a positive-type resist (ZPP-1850 manufactured by Nippon Zeon Co., Ltd., Japan) was applied by means of a spin coater to a thickness of 1 μm, and dried at 110° C. for 90 seconds. Thereafter, 150 mJ of light having a wavelength of 365 nm was applied only to a part of the resist film that was between the borders of the line pattern on the ITO, and the exposed resist was developed by using an organic amine developer. The resist developed was baked at 130° C. for 10 minutes to form an insulating layer on the ITO substrate between the borders of the line pattern thereon. The above-prepared photocatalyst-containing-layer-forming coating liquid A-1 was applied to the entire surface of this ITO substrate by means of a spin coater, and then dried at 150° C. for 10 minutes to carry out hydrolysis and polycondensation reactions, thereby forming a 100-angstrom thick transparent photocatalyst-containing layer in which the photocatalyst was firmly fixed in the organosiloxane. Subsequently, light (wavelength: 365 nm) emitted from a mercury vapor lamp was applied, through a mask, to the photocatalyst-containing layer with an illumination intensity of 70 mW/cm$^2$ for 50 seconds. Thus, only a part (width: 170μm; 4 μm wider, on both the right and left sides, than the line width of the line pattern on the ITO) of the photocatalyst-containing layer that corresponded to the border of the line pattern on the ITO substrate was exposed to the light.

Next, poly(3,4)ethylenedioxythiophene/polystyrenesulfon ate (abbreviation: PEDOT/PSS, trade name: Baytron PTP AI 4083, product of Bayer A.G.) was applied with a spin coater to the entire surface of the photocatalyst-containing layer that had been subjected to pattern-wise exposure, and dried at 130° C. A PEDOT film having a thickness of approximately 1000 angstroms was thus formed only on the exposed part of photocatalyst-containing layer that corresponded to the border of the line pattern on the ITO. To the entire surface of this, the above-described EL-layer-forming coating liquid A-1 was further applied with a spin coater. Lastly, as an upper electrode, a 5-angstrom thick LiF film and a 2000-angstrom thick aluminum film were respectively deposited pattern-wise by using the same mask so that the pattern of this electrode and those of the ITO and of the organic EL layer would be orthogonal to each other. When the EL device thus obtained was driven by the use of the ITO electrode and the Al upper electrode as address electrodes, it emitted light of green color.

Example A-1-2

The procedure of Example A-1-1 was repeated, provided that the thickness of the photocatalyst-containing layer was decreased to 2000 angstroms by decreasing the amount (parts by weight) of the isopropyl alcohol used as a solvent for preparing the photocatalyst-containing-layer-forming coating liquid A-1. The EL device thus obtained emitted light of green color.

Example A-1-3

The procedure of Example A-1-1 was repeated, provided that the PEDOT layer was not provided. The EL device thus obtained emitted light of green color.

Example A-1-4

The procedure of Example A-1-2 was repeated, provided that the PEDOT layer was not provided. The EL device thus obtained emitted light of green color.

Example A-1-5

The procedure of Example A-1-3 was repeated, provided that the photocatalyst-containing-layer-forming coating liquid A-1 used in Example A-1-3 was replaced with a photocatalyst-containing-layer-forming coating liquid A-2 having the composition below described. The EL device thus obtained emitted light of green color.
(Photocatalyst-Containing-Layer-Forming Coating Liquid A-2)

| | |
|---|---|
| Photocatalyst inorganic coating agent (ST-K03 manufactured by Ishihara Sangyo Kaisha, Ltd., Japan) | 2 parts by weight |

-continued

| | |
|---|---|
| Fluoroalkoxysilane (MF-160E manufactured by TOHKEM PRODUCTS CORPORATION, Japan) | 0.001 parts by weight |
| 2N Hydrochloric acid | 4 parts by weight |
| Isopropyl alcohol | 7.5 parts by weight |

Example B-1-1

The procedure of Example A-1-3 was repeated, provided that the organic- EL-layer-forming coating liquid used in Example A-1-3 was replaced with the following coating liquids:

a coating liquid for forming a luminous layer of green color: the same as the organic-EL-layer-forming coating liquid in Example A-1-3;

a coating liquid for forming a luminous layer of red color: having the same composition as that of the organic-EL-layer-forming coating liquid in Example A-1-3 except that the coumarin was replaced with Nile Read; and a coating liquid for forming a luminous layer of blue color: having the same composition as that of the organic-EL-layer-forming coating liquid in Example A-1-3 except that the coumarin was replaced with perylene.

The structural formula of Nile Red is as follows:

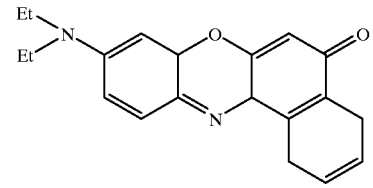

The structural formula of perylene is as follows:

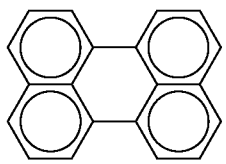

Light was applied only to a part of the photocatalyst-containing layer to which the above-described coating liquids of the three colors were supposed to be applied. The coating liquids were then applied to the exposed part of the photocatalyst-containing layer in the same manner as in Example A-1-3, using an ink-jetting apparatus. Namely, on a part of the photocatalyst-containing layer that corresponded to the border of the patterned electrode on the ITO substrate provided with the insulating layer, the coating liquids were alternately applied, and dried at 80° C. for 30 minutes. A 100-nm thick luminous layer composed of sections of the three colors was thus formed only on the exposed part of the photocatalyst-containing layer.

A 150-nm thick AlLi alloy film was deposited as an upper electrode by using a mask so that the pattern of this electrode and those of the ITO electrode and of the organic EL layer would be orthogonal to each other, thereby obtaining a tricolor simple-matrix-addressed EL device.

When this EL device was driven by the use of the ITO electrode and the AlLi upper alloy electrode as address electrodes, it was confirmed to have excellent displaying performance.

Example B-1-2

The procedure of Example B-1-1 was repeated, provided that the coating liquids were alternately applied not by the ink-jetting apparatus used in Example B-1-1 but by a gravure-printing machine.

When this tricolor simple-matrix-addressed EL device thus obtained was driven by the use of the ITO electrode and the AlLi upper alloy electrode as address electrodes, it was confirmed to have excellent displaying performance.

Example B-1-3

After cleaning an ITO substrate provided with a line pattern with a height of 0.15 μm, a line width of 200 μm and a line spacing of 200 μm, a 20-nm thick photocatalyst-containing layer was formed on the entire surface of this ITO substrate in the same manner as in Example B-1-1. Subsequently, light (wavelength: 365 nm) emitted from a mercury vapor lamp was applied through a mask with an illumination intensity of 70 mW/cm$^2$ for 50 seconds only to a part of the photocatalyst-containing layer that corresponded to the part between the borders of the patterned ITO electrode.

To this was then applied, with a dip coater, an ultraviolet-curing resin solution consisting of an ultraviolet-curing resin (PEG400DA manufactured by Nippon Kayaku Co., Ltd., Japan) and an initiator (Darocur 1173 available from Ciba Specialty Chemicals K.K., Japan) in an amount of 5% by weight of the ultraviolet-curing resin. The ultraviolet-curing resin solution adhered only to the exposed part of the photocatalyst-containing layer that corresponded to the part between the borders of the patterned ITO electrode.

To the entire surface of this, light (wavelength: 365 nm) emitted from a mercury vapor lamp was applied with an illumination intensity of 70 mW/cm$^2$ for 50 seconds to cure the ultraviolet-curing resin to form a 0.2-μm thick partitioning layer with a spacing of 200 μm. At the same time, the wettability of a part of the photocatalyst-containing layer that corresponded to the border of the patterned ITO electrode was increased to a contact angle with water of approximately 0°.

Thereafter, the organic-EL-layer-forming coating liquids of green, red and blue used in Example B-1-1 were alternately applied to the exposed part of the photocatalyst-containing layer that corresponded to the border of the patterned ITO electrode by the use of an ink-jetting apparatus, and then dried at 80° C. An organic El layer having a thickness of 100 nm was thus formed between the borders of the patterned partitioning layer.

An AlLi alloy film was deposited as an upper electrode by using a mask so that the thickness, line width and line spacing of the resulting patterned film would be 150 nm, 200 μm and 200 μm, respectively and that the pattern of this film and those of the ITO electrode and of the organic EL layer would be orthogonal to each other, thereby obtaining a tricolor simple- matrix-addressed EL device.

When this EL device was driven by the use of the ITO electrode and the AlLi alloy upper electrode as address electrodes, it was confirmed to have excellent displaying performance.

Example B-1-4

A cleaned glass substrate was spin-coated with the photocatalyst-containing-layer-forming coating liquid described in Example B-1-1. The coating liquid was then dried at 150° C. for 10 minutes to carry out hydrolysis and polycondensation reaction, thereby forming a 20-nm thick transparent photocatalyst-containing layer in which the photocatalyst was firmly fixed in the organosiloxane. To this photocatalyst-containing layer, light (wavelength: 365 nm) emitted from a mercury vapor lamp was applied with an illumination intensity of 70 mW/cm$^2$ for 50 seconds through a mask having a line pattern with a line width of 200 μm and a line spacing of 200 μm. ITO was then sputtered so that a 0.15-μm thick ITO film would be formed only on the exposed part of the photocatalyst-containing layer.

To this was then applied, by means of a bead coater, the organic-EL-layer-forming coating liquid used in Example B-1-1. As a result, the organic-EL-layer-forming coating liquid adhered only to the ITO layer. This coating liquid was then dried in an oven at 80° for 30 minutes to obtain a patterned organic EL layer having a thickness of 100 nm.

Only to a part of the photocatalyst-containing layer on which the organic EL layer had not been formed, light (wavelength: 365 nm) emitted from a mercury vapor lamp was applied from the organic EL layer side with an illumination intensity of 70 mW/cm$^2$ for 50 seconds through a mask having a line pattern with a line width of 200 μm. To the exposed part of the photocatalyst-containing layer was then applied the ultraviolet-curing resin solution described in Example B-1-5 by means of an ink-jetting apparatus. Thereafter, light (wavelength: 365 nm) emitted from a mercury vapor lamp was applied, through a mask, only to the ultraviolet-curing resin solution applied with an illumination intensity of 70 mW/cm$^2$ for 50 seconds, thereby providing a partitioning layer having a thickness of 0.2 μm.

An AlLi alloy film was deposited as an upper electrode by using the same mask as in Example B-1-1 so that the thickness, line width and line spacing of the resulting film would be 150 nm, 200 μm and 200 μm, respectively and that the pattern of this film and those of the ITO electrode and of the organic EL layer would be orthogonal to each other, thereby obtaining a mono-color simple-matrix-addressed EL device.

When this EL device was driven by the use of the ITO electrode and the AlLi alloy upper electrode as address electrodes, it was confirmed to have excellent displaying performance.

Example B-1-5

The procedure of Example B-1-4 was repeated, provided that the coating liquid for forming an organic EL layer of a single color used in Example B-1-4 was replaced with the coating liquids for forming luminous layers of the three colors of green, red and blue described in Example B-1-1 and that these coating liquids were alternately applied by the use of an ink-jetting apparatus. The EL device obtained was a tricolor simple-matrix-addressed EL device excellent in displaying performance.

Example B-2-1

The procedure of Example B-1-1 was repeated to obtain an EL device, provided that the thickness of the photocatalyst-containing layer was changed to 50 angstroms. A three-colored line pattern originating from the luminous layers of the three colors did not appear on the EL device obtained.

Example B-2-2

The procedure of Example B-1-1 was repeated to obtain an EL device, provided that the thickness of the photocatalyst-containing layer was changed to 3000 angstroms. The EL device obtained did not emit light at all.

Example B-2-3

The procedure of Example B-1-1 was repeated to obtain an EL device, provided that the photocatalyst-containing layer was not provided. A three-colored line pattern originating from the luminous layers of the three colors did not appear on the EL device obtained.

Example B-2-4

The procedure of Example B-1-1 was repeated to obtain an EL device, provided that a PEDOT layer was provided instead of the photocatalyst-containing layer. A three-colored line pattern originating from the luminous layers of the three colors did not appear on the EL device obtained.

Example C-1-1

(Preparation of Photocatalyst-Containing-Layer-Forming Coating Liquid)

A photocatalyst-containing-layer-forming coating liquid having the following composition was firstly prepared.

| | |
|---|---|
| Photocatalyst inorganic coating agent (ST-K03 manufactured by Ishihara Sangyo Kaisha, Ltd., Japan) | 6 parts by weight |
| Fluoroalkoxysilane (MF-160E manufactured by TOHKEM PRODUCTS CORPORATION, Japan) | 1.26 parts by weight |
| 1N Hydrochloric acid | 12 parts by weight |
| Isopropyl alcohol | 58.5 parts by weight |

(Formation of Photocatalyst-Containing Layer)

The above-prepared photocatalyst-containing-layer-forming coating liquid was applied to a cleaned glass substrate by means of a spin coater, and dried at 150° C. for 10 minutes to carry out hydrolysis and polycondensation reaction, thereby forming a 20-nm thick transparent photocatalyst-containing layer in which the photocatalyst was firmly fixed in the organosiloxane.

(Formation of Latent Pattern due to Difference in Wettability on Photocatalyst-Containing Layer)

Light (wavelength: 365 nm) emitted from a mercury vapor lamp was applied through a mask to the photocatalyst-containing layer with an illumination intensity of 70 mW/cm$^2$ for 50 seconds. The contact angel with water of the exposed part of the photocatalyst-containing layer and that of the unexposed part of the same were measured by the use of a contact angle meter (CA-Z type, manufactured by Kyowa Interface Science Co. LTD, Japan). The measurement was carried out 30 seconds after water was dropped from a micro-syringe to the surface of the photocatalyst-containing layer. The results were as follows: the contact angle with water of the unexposed part was 142°, while that of the exposed part was not more than 10°. It was thus confirmed that it was possible to form, on the photocatalyst-containing layer, a latent pattern due to the difference in wettability between the exposed part and the unexposed part.

(Preparation of Luminous-Layer-Forming Coating Liquid)

A coating liquid having the following composition was prepared to form a luminous layer for an organic EL device.

| | |
|---|---|
| Polyvinyl carbazole | 70 parts by weight |
| Coumarin 6 | 1 part by weight |
| Oxadiazole compound | 30 parts by weight |
| 1,1,2-Trichloroethane | 663 part by weight |

(Production of Organic EL device)

After cleaning an ITO substrate, the above-described photocatalyst-containing layer having a thickness of 20 nm was formed on the entire surface of the substrate. Subsequently, light (wavelength: 365 nm) emitted from a mercury vapor lamp was applied to the photocatalyst-containing layer with an illumination intensity of 70 mW/cm$^2$ for 50 seconds through a mask having 5-mm square openings.

Next, when the organic-EL-layer-forming coating liquid was applied to the entire surface of the above photocatalyst-containing layer by the use of a spin coater, the coating liquid adhered only to the 5-mm square exposed parts of the photocatalyst-containing layer. This coating liquid was dried at 80° C. to form a luminous layer having a thickness of 100 nm only on the exposed part of the photocatalyst-containing layer.

On the entire surface of this, a 500-nm thick AlLi alloy film was deposited as an upper electrode to obtain an EL device. The EL device caused pattern-wise emission of light.

Example C-1-2

Like in Example C-1-1, after cleaning an ITO substrate, the above-described photocatalyst-containing layer having a thickness of 200 nm was formed on the entire surface of the substrate. Subsequently, light (wavelength: 365 nm) emitted from a mercury vapor lamp was applied to the photocatalyst-containing layer with an illumination intensity of 70 mW/cm$^2$ for 50 seconds through a mask having 5-mm square openings. Thereafter, the photocatalyst-containing layer was spin-coated with a commercially available conductive coating liquid (PEDOT manufactured by Bayer A.G.) as a hole-injection-layer-forming coating liquid. As a result, the coating liquid adhered only to the 5-mm square exposed parts of the photocatalyst-containing layer. This coating liquid was then heated at 80° C. for 30 minutes to form a 50-nm thick hole-injection layer in a 5-mm square pattern. To the entire surface of this, the luminous-layer-forming coating liquid described in Example C-1-1 was applied, and dried at 80° C., whereby a luminous layer having a thickness of 100 nm was formed on the entire surface.

On top of the entire surface of this, a 50-nm thick AlLi alloy film was deposited as an upper electrode to obtain an EL device. The EL caused pattern-wise emission of light.

Example C-1-3

After cleaning an ITO substrate, the above-described photocatalyst-containing layer having a thickness of 200 nm was formed on the entire surface of the substrate. Subsequently, while masking 5-mm square parts of the photocatalyst-containing layer, light (wavelength: 365 nm) emitted from a mercury vapor lamp was applied with an illumination intensity of 70 mW/cm$^2$ for 50 seconds. To this was then applied, with a spinner, an ultraviolet-curing resin solution consisting of a commercially available ultraviolet-curing resin (trade name PEG400DA, manufactured by Nippon Kayaku Co., Ltd., Japan) and an initiator (trade name Darocure 1173, available from Ciba Specialty Chemicals K.K., Japan) in an amount of 5% by weight of the ultraviolet-curing resin. As a result, the ultraviolet-curing resin solution adhered only to a part of the photocatalyst-containing layer other than the 5-mm square parts. Thereafter, to the entire surface of this, light (wavelength: 365 nm) emitted from a mercury vapor lamp was applied with an illumination intensity of 70 mW/cm$^2$ for 50 seconds to cure the ultraviolet-curing resin, and, at the same time, to increase the wettability of the 5-mm square parts of the photocatalyst-containing layer. To this, the luminous-layer-forming coating liquid described in Example C-1-1 was entirely applied, and dried at 80° C. to form a luminous layer. On the entire surface of the luminous layer, a 500-nm thick AlLi alloy film was deposited as an upper electrode to obtain an EL device. This EL device caused pattern-wise emission of light.

Example D-1-1

A coating liquid having the following composition was prepared.
(Coating Liquid D-1: Photocatalyst-Containing-Layer-Forming Coating Liquid)

| | |
|---|---|
| Photocatalyst inorganic coating agent (ST-K03 manufactured by Ishihara Sangyo Kaisha, Ltd., Japan) | 6 parts by weight |
| Fluoroalkoxysilane (MF-160E manufactured by TOHKEM PRODUCTS CORPORATION, Japan) | 1.26 parts by weight |
| 1N Hydrochloric acid | 12 parts by weight |
| Isopropyl alcohol | 58.5 parts by weight |

The above ingredients were mixed one after another, and the mixture was stirred at 100° C. for 20 minutes, and then diluted with 10 parts by weight of isopropyl alcohol to obtain coating liquid D-1 (the above photocatalyst is called "DSR" for short).
(Coating Liquids D-2 and D-3: Coating Liquids for Forming Photocatalyst-Containing Layer Containing Substance Capable of Improving Light Emission Properties)

The above-prepared coating liquid D-1 and an aqueous dispersion of poly-3,4-ethylenedioxy thiophene/polystyrenesulfonate (abbreviation: PEDOT/PSS, trade name: Baytron PT PAI4083, product of Bayer A.G.) were mixed at the weight ratios of 2:1 and 1:2 to obtain coating liquids D-2 and D-3, respectively.
(Coating Liquids D-4, D-5 and D-6)

0.0324 g of FeCl$_3$ was dissolved in 20 g of isopropyl alcohol, and 0.157 g of this solution and 4 g of the above coating liquid D-1 were mixed to obtain coating liquid D-4.

The same procedure was repeated except that 0.0324 g of FeCl$_3$ was replaced with 0.0483 g of copper (III) nitrate trihydrate, thereby obtaining liquid D-5.

The same procedure was repeated except that 0.0324 g of FeCl$_3$ was replaced with 0.056 g of manganese (II) nitrate hexahydrate, thereby obtaining liquid D-6.
(Coating Liquid D-7: EL-Layer-Forming Coating Liquid)

| | |
|---|---|
| Polyfluorene derivative | 1 part by weight |
| Xylene | 66.67 parts by weight |

The above polyfluorene derivative was synthesized in the following manner.

In the stream of dry nitrogen, 5.0 g (30 mmol) of fluorene was dissolved in dry tetrahydrofuran. To this solution, 22 ml (35 mmol) of a 1.6 M hexane solution of n-butyllithium was added dropwise at −78° C., and the mixture was stirred at the temperature for 1 hour. To this was then added dropwise 4.9 ml (35 mmol) of n-hexyl bromide, and the mixture was stirred at −78° C. for 1 hour, and then at room temperature for 1 hour. To the resultant, 22 ml (35 mmol) of a 1.6 M hexane solution of n-butyllithium was further added dropwise at −78° C., and the mixture was stirred at the temperature for 1 hour. To this was then added dropwise 4.9 ml (35 mmol) of n-hexyl bromide, and the mixture was stirred at −78° C. for 1 hour, and then at room temperature for 1 hour. Water was added dropwise to this mixture with ice-cooling, and the resultant was then subjected to extraction with ethyl acetate. The extract was dehydrated and dried over magnesium sulfate, and the solvent was then distilled off. The residue was subjected to recrystallization from hexane to obtain 9.5 g (95%) of 9,9-dihexylfluorene.

2.0 g (6.0 mmol) of the 9,9-dihexylfluorene and 0.02 g (0.12 mmol) of iron chloride (III) were dissolved in 9 ml of chloroform. While shading the light, 1.2 g of bromine dissolved in 3 ml of chloroform was added dropwise to the above solution with stirring at 0° C. This mixture was stirred at room temperature for 18 hours, washed with an aqueous sodium thiosulfate solution, and dehydrated and dried over magnesium sulfate. The solvent was then distilled off. The residue was purified by column chromatography (eluent: hexane) to isolate 2.4 g (92%) of 2,7-dibromo-9,9-dihexylfuorene.

In the stream of dry nitrogen, 2.0 g (40 mmol) of the 2,7-dibromo-9,9-dihexylfluorene was dissolved in 40 ml of dry tetrahydrofuran. To this solution, 5.3 ml (8.4 mmol) of a 1.6 M hexane solution of n-butyllithium was added dropwise with ice-cooling, and the mixture was stirred at 0° C. for 1 hour. To this was then added dropwise 2.0 ml (10 mmol) of 2-isopropoxy-4,4,5,5-tetramethyl-1,3,2-dioxaborane, and the mixture was stirred at 0° C. for 1 hour, and then at room temperature for 12 hours. Water was added dropwise to this mixture with ice-cooling, and the resultant was subjected to extraction with diethyl ether. The extract was dehydrated and dried over magnesium sulfate, and the solvent was distilled off. After washing with ethanol, the residue was subjected to recrystallization from an ethanol/hexane solvent mixture to obtain 1.4 g (60%) of 2,7-bis(4,4,5,5-tetramethyl-1,3,2-dioxaborane-2-yl)-9,9-dihexylfluorene.

In the stream of dry nitrogen, 0.53 g of the 2,7-bis(4,4,5,5-tetramethyl-1,3,2-dioxaborane-2-yl)-9,9-dihexylfluorene, 0.45 g of the 2,7-dibromo-9,9-dihexylfluorene, and 0.02 g of tetrakis (trisphenylphosphine)-paradium were dissolved in 18 ml of dry toluene. To this solution was added 27 ml of a 2 M aqueous sodium carbonate solution, and the mixture was stirred at 100° C. for 48 hours with heating. After cooling, this mixture was poured into methanol. The precipitates were washed with a dilute aqueous hydrochloric acid solution. By using a Soxhlet apparatus, and acetone as a solvent, the nonvolatile matter was extracted from the precipitates. The residue was dissolved in chloroform, and the solution was subjected to reprecipitation to obtain the desired polyfluorene derivative.

An ITO glass substrate was subjected to patterning to form a 12-mm wide strip on its central part. After cleaning and surface-treating this glass substrate, the above-described coating liquid D-1, D-2, D-3, D-4, D-5 or D-6 was applied to the substrate with a spin coater, and dried and baked in a clean oven at 150° C. for 10 minutes to form a thin film having a thickness of 50 nm. Subsequently, light (dominant wavelength: 365 nm) emitted from a high pressure mercury-vapor lamp was applied to this thin film of coating liquid D-1, D-2, D-3, D-4, D-5 or D-6 in an exposure of 5000 mJ. To each exposed thin film, the above-prepared coating liquid D-7 was applied by means of a spin coater to form a thin film having a thickness of 100 nm. Lastly, a 0.5-nm thick LiF film and a 150-nm thick aluminum film were respectively deposited as an upper electrode by using a mask so that the pattern of these films and that of the ITO would be orthogonal to each other. The EL devices respectively obtained in this manner were driven by the use of the Al upper electrode and the ITO electrode as address electrodes. As a result, the EL devices were observed to emit light.

Figure 11:
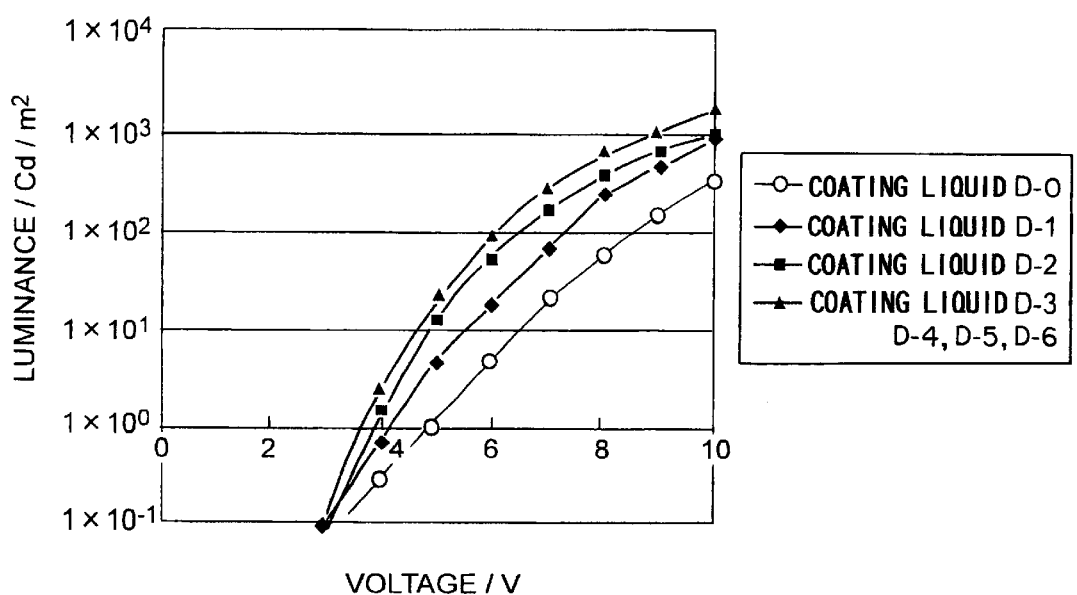
FIG. 11 is a graph showing the light emission properties of the EL devices of Example D-1.

The light emission properties of these EL devices were examined. As a result, the relationships between luminance and voltage as shown in FIG. 11 were obtained. The EL device in which the photocatalyst-containing layer was not provided is herein referred to as EL device D-0. Coating liquids D-4, D-5 and D-6 are similar to coating liquid D-3, so that the data regarding the EL devices whose photocatalyst-containing layers were formed by using coating liquids D-3, D-4, D-5 and D-6 (hereinafter referred to as EL devices D-3, D-4, D-5 and D-6, respectively) are plotted collectively.

As shown in FIG. 11, the EL devices provided with photocatalyst-containing layers are driven at low applied voltages, and have high luminous efficiencies as compared with EL device D-0 provided with no photocatalyst-containing layer. Both the EL device whose photocatalyst-containing layer was formed by using coating liquid D-2 (hereinafter referred to as EL device D-2) and EL device D-3 contain a substance capable of improving light emission properties in their photocatalyst-containing layers. Although these two EL devices have slightly decreased luminous efficiencies, they are driven at low applied voltages, and have high luminances as compared with the EL device whose photocatalyst-containing layer was formed by using coating liquid D-1 (hereinafter referred to as EL device D-1).

Furthermore, the data shown in the following table demonstrate that EL devices D-4, D-5 and D-6, each having a photocatalyst-containing layer that contains a substance capable of improving light emission properties, have high luminous efficiencies as compared with EL device D-1.

| Luminous Efficiency (cd/A) | |
|---|---|
| EL Device D-0 | 0.35 |
| EL Device D-1 | 1.05 |
| EL Device D-2 | 0.70 |
| EL Device D-3 | 0.62 |
| EL Device D-4 | 1.46 |
| EL Device D-5 | 1.33 |
| EL Device D-6 | 1.44 |

What is claimed is:

1. An electroluminescent device comprising:

a first electrode;

an electroluminescent layer formed on the first electrode; and a second electrode formed on the electroluminescent layer, said device further comprising a wettability-changing layer that is capable of changing wettability when light energy is applied thereto, wherein the layer of a material whose wettability changes when light is applied thereto is a photocatalyst-containing layer, and the electroluminescent device can display, by the emission of light, a pattern that is different from either the pattern of the first electrode or that of the second electrode.

2. The electroluminescent device according to claim 1, comprising at least one patterned buffer layer, charge-injection layer, charge-transfer layer or luminous layer on the photocatalyst-containing layer, capable of displaying, by the emission of light, a pattern corresponding to the pattern of the buffer, charge-injection, charge-transfer or luminous layer.

3. The electroluminescent device according to claim 1, in which either the first electrode or the second electrode is anode, which comprises the photocatalyst-containing layer formed on the anode, a patterned hole-injection layer formed on the photocatalyst-containing layer, and a luminous layer formed on the hole-injection layer, and which can display, by the emission of light, a pattern corresponding to the pattern of the hole-injection layer.

4. The electroluminescent device according to claim 1, comprising at least one patterned insulating layer on the photocatalyst-containing layer, capable of displaying, by the emission of light, a pattern corresponding to the part where the insulating layer does not exist.

5. The electroluminescent device according to claim 4, wherein the insulating layer is made from an ultraviolet-curing resin.

6. The electroluminescent device according to claim 1, wherein the first electrode is formed on a substrate, and the layer of a material whose wettability changes when light is applied thereto is a photocatalyst-containing layer, at least one photocatalyst-containing layer being formed at any position between the substrate and the second electrode, the photocatalyst-containing layer containing a substance capable of improving light emission properties.

7. The electroluminescent device according to claim 6, wherein at least one insulating layer is partially formed on the photocatalyst-containing layer.

8. The electroluminescent device according to claim 7, wherein at least one insulating layer made from a photosetting or thermosetting resin is partially formed on the photocatalyst-containing layer to make a part of the photocatalyst-containing layer on which the insulating layer is formed non-luminous.

9. The electroluminescent device according to claim 6, wherein the substance capable of improving light emission properties comprises a metal salt.

10. A process for producing an electroluminescent device which comprises a layer of a material whose wettability changes when light is applied thereto, a first electrode formed on the layer of a material whose wettability changes when light is applied thereto, an electroluminescent layer formed on the first electrode, and a second electrode formed on the electroluminescent layer, comprising the steps of applying light pattern-wise to the layer of a material whose wettability changes when light is applied thereto, thereby forming on the layer a latent pattern due to the difference in wettability, applying a first-electrode-forming coating liquid to the exposed part of the layer of a material whose wettability changes when light is applied thereto, thereby forming pattern-wise the first electrode, forming the electroluminescent layer on the patterned first electrode, and forming the second electrode on the electroluminescent layer.

11. The process for producing the electroluminescent device according to claim 10, comprising the step of forming, in advance on a substrate, the layer of a material whose wettability changes when light is applied thereto.

12. The process for producing the electroluminescent device according claim 10, wherein the layer of a material whose wettability changes when light is applied thereto is a photocatalyst-containing layer.

13. The process for producing the electroluminescent device according to claim 12, wherein the unexposed part of the photocatalyst-containing layer is water-and/or oil-repellent, and the exposed part of the same has increased wettability.

14. The process for producing the electroluminescent device according to claim 10, the first-electrode-forming coating liquid contains a polar solvent, and the application of this coating liquid is conducted by a method selected from spin coating, ink-jetting, dip coating, blade coating, printing, dispensing, and dropping of the coating liquid on the photocatalyst-containing layer.

15. The process for producing the electroluminescent device according to claim 10, wherein the patterning of the first electrode that is conducted after the first-electrode-forming coating liquid is applied is effected by a method selected from a method in which the layer of a material whose wettability changes when light is applied thereto is inclined before the first-electrode-forming coating liquid applied is solidified, a method in which air is blown, and a method in which an adhesive tape is adhered to the solidified first-electrode-forming coating liquid and then peeled off.

16. The process for producing the electroluminescent device according to claim 10, wherein at least one of the first electrode, the second electrode and the electroluminscent layer is formed by vacuum deposition, and the patterning of the vacuum-deposited layer is conducted by adhering thereto an adhesive tape, followed by peeling.

17. The process for producing the electroluminescent device according to claim 10, wherein the photocatalyst-containing layer contains a substance capable of improving light emission properties.

18. A process for producing an electroluminescent device which comprises a first electrode, a layer of a material whose wettability changes when light is applied thereto formed on the first electrode, an electroluminescent layer formed on the layer of a material whose wettability changes when light is applied thereto, and a second electrode formed on the electroluminescent layer, comprising the steps of forming, on the first electrode, the layer of a material whose wettability changes when light is applied thereto, applying light pattern-wise to the layer of a material whose wettability changes when light is applied thereto, thereby forming on the layer a latent pattern due to the difference in wettability, applying an electroluminescent-layer-forming coating liquid to the exposed part of the layer of a material whose wettability changes when light is applied thereto, thereby forming pattern-wise the electroluminescent layer, and forming the second electrode on the patterned electroluminescent layer.

19. The process for producing the electroluminescent device according to claim 18, comprising the step of forming, in advance, the first electrode on a substrate.

20. The process for producing the electroluminescent device according to claim 18, wherein the application of the electroluminescent-layer-forming coating liquid is conducted by a method selected from spin coating, ink-jetting, dip coating, blade coating, printing, dispensing, and dropping of the coating liquid on the photocatalyst-containing layer.

21. The process for producing the electroluminescent device according to claim 18, wherein the patterning of the electroluminescent layer that is conducted after the electroluminescent-layer-forming coating liquid is applied is effected by a method selected from a method in which the layer of a material whose wettability changes when light is applied thereto is inclined before the electroluminescent-layer-forming coating liquid applied is solidified, a method in which air is blown, and a method in which an adhesive tape is adhered to the solidified electroluminescent-layer-forming coating liquid and then peeled off.

22. The process for producing the electroluminescent device according to claim 18, wherein the electroluminescent device is a full-color display, and picture elements on the display correspond to the latent pattern due to the difference in the wettability formed on the photocatalyst-containing layer.

23. The process for producing the electroluminescent device according to claim 18, wherein the first and second electrodes are formed pattern-wise, the electroluminescent layer is a luminous layer, and the application of light is conducted correspondingly to the pattern of the first electrode.

24. The process for producing the electroluminescent device according to claim 18, wherein the luminous layer is laminated through at least one of a buffer layer and a charge-transfer layer.

25. The process for producing the electroluminescent device according to claim 18, wherein the lamination of the luminous layer or the partitioning layer is effected by a method selected from ink-jetting, uniform coating, and pattern-printing.

26. The process for producing the electroluminescent device according to claim 18, wherein the lamination of the luminous layer or the partitioning layer is effected by vacuum deposition, and the film deposited on the unexposed part of the wettability-changeable material layer is stripped.

27. A process for producing an electroluminescent device which comprises a first electrode, an electroluminescent layer formed on the first electrode, a layer of a material whose wettability changes when light is applied thereto formed on the electroluminescent layer, and a second electrode formed on the layer of a material whose wettability changes when light is applied thereto, comprising the steps of forming the electroluminescent layer on the first electrode, forming, on the electroluminescent layer, the layer of a material whose wettability changes when light is applied thereto, applying light pattern-wise to the layer of a material whose wettability changes when light is applied, thereby forming on the layer a latent pattern due to the difference in wettability, and applying a second-electrode-forming coating liquid to the exposed part of the layer of a material whose wettability changes when light is applied thereto, thereby forming pattern-wise the second electrode.

28. The process for producing the electroluminescent device according to claim 27, wherein the second-electrode-forming coating liquid contains a polar solvent, and the application of this coating liquid is conducted by a method selected from spin coating, ink-jetting, dip coating, blade coating, printing, dispensing, and dropping of the coating liquid on the photocatalyst-containing layer.

29. The process for producing the electroluminescent device according to claim 27, wherein the patterning of the second electrode that is conducted after the second-electrode-forming coating liquid is applied is effected by a method selected from a method in which the layer of a material whose wettability changes when light is applied thereto is inclined before the second-electrode-forming coating liquid applied is solidified, a method in which air is blown, and a method in which an adhesive tape is adhered to the solidified second-electrode-forming coating liquid and then peeled off.

30. A process for producing an electroluminescent device which comprises a first electrode, a first electroluminescent layer formed on the first electrode, a layer of a material whose wettability changes when light is applied thereto formed on the first electroluminescent layer, a second electroluminescent layer formed on the layer of a material whose wettability changes when light is applied thereto, and a second electrode formed on the second electroluminescent layer, comprising the steps of forming the first electroluminescent layer on the first electrode, forming, on the first electroluminescent layer, the layer of a material whose wettability changes when light is applied thereto, applying light pattern-wise to the layer of a material whose wettability changes when light is applied thereto, thereby forming on the layer a latent pattern due to the difference in wettability, applying a second electroluminescent-layer-forming coating liquid to the exposed part of the layer of a material whose wettability changes when light is applied thereto, thereby forming pattern-wise the second electroluminescent layer, and forming the second electrode on the patterned second electroluminescent layer.

31. The process for producing the electroluminescent device according to claim 30, wherein the patterning of the electroluminescent layer that is conducted after the second-electroluminescent-layer-forming coating liquid is applied is effected by a method selected from a method in which the layer of a material whose wettability changes when light is applied thereto is inclined before the second-electroluminescent-layer-forming coating liquid applied is solidified, a method in which air is blown, and a method in which an adhesive tape is adhered to the solidified second-electroluminescent-layer-forming coating liquid and then peeled off.

32. A process for producing an electroluminescent device which comprises a first electrode, a layer of a material whose wettability changes when light is applied thereto formed on the first electrode, an electroluminescent layer formed on the layer of a material whose wettability changes when light is applied thereto, and a second electrode formed on the electroluminescent layer, comprising the steps of forming, on the first electrode, the layer of a material whose wettability changes when light is applied thereto, applying light pattern-wise to the layer of a material whose wettability changes when light is applied thereto, thereby forming on the layer a latent pattern due to the difference in wettability, applying an insulating-layer-forming coating liquid to the exposed part of the layer of a material whose wettability changes when light is applied thereto, thereby forming pattern-wise the insulating layer, applying an electroluminescent-layer-forming coating liquid to the layer of a material whose wettability changes when light is applied thereto, on which the insulating layer has been formed, and forming the second electrode on the electroluminescent layer.

33. The process for producing the electroluminescent device according to claim 32, wherein the insulating layer is made from an ultraviolet-curing resin.

34. A process for producing an electroluminescent device which comprises a first electrode, a layer of a material whose wettability changes when light is applied thereto formed on the first electrode, a partitioning layer and a luminous layer formed on the layer of a material whose wettability changes when light is applied thereto, and a second electrode formed on the luminous layer, comprising the steps of laminating, to the patterned first electrode, the layer of a material whose wettability changes when light is applied thereto, applying light only to a part of the layer of a material whose wettability changes when light is applied thereto that corresponds to the part between the borders of the patterned first electrode, through a mask having the negative pattern of the pattern of the first electrode, laminating the partitioning layer to the exposed part of the layer of a material whose wettability changes when light is applied thereto that corresponds to the part between the borders of the patterned first electrode, by utilizing the difference in wettability between the exposed part and the unexposed part of the layer of a material whose wettability changes when light is applied thereto, laminating the luminous layer between the borders of the patterned partitioning layer after applying light to the entire surface of the above semi-finished product, and laminating pattern-wise the second electrode to the luminous layer and the partitioning layer.

35. A process for producing an electroluminescent device which comprises a layer of a material whose wettability changes when light is applied thereto, a first electrode and a partitioning layer formed on the layer of a material whose wettability changes when light is applied thereto, a luminous layer formed on the first electrode, and a second electrode formed on the luminous layer and the partitioning layer, comprising the steps of forming pattern-wise the first electrode on the layer of a material whose wettability changes when light is applied thereto, laminating the luminous layer to the patterned first electrode by utilizing the difference in wettability between the layer of a material whose wettability changes when light is applied thereto and the patterned first electrode, applying light to a part of the layer of a material whose wettability changes when light is applied thereto that corresponds to the part between the borders of the patterned first electrode, laminating the partitioning layer to the exposed part of the layer of a material whose wettability changes when light is applied thereto, and laminating pattern-wise the second electrode to the luminous layer and the partitioning layer.

* * * * *